(12) United States Patent
Asano et al.

(10) Patent No.: US 10,019,863 B2
(45) Date of Patent: Jul. 10, 2018

(54) MAGNETIC SENSOR DEVICE

(71) Applicant: MITSUBISHI ELECTRIC CORPORATION, Chiyoda-ku (JP)

(72) Inventors: Hiroyuki Asano, Chiyoda-ku (JP); Tomokazu Ogomi, Chiyoda-ku (JP); Kenji Shimohata, Chiyoda-ku (JP); Sadaaki Yoshioka, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/315,176

(22) PCT Filed: Jun. 9, 2015

(86) PCT No.: PCT/JP2015/066574
§ 371 (c)(1),
(2) Date: Nov. 30, 2016

(87) PCT Pub. No.: WO2015/190468
PCT Pub. Date: Dec. 17, 2015

(65) Prior Publication Data
US 2017/0154487 A1     Jun. 1, 2017

(30) Foreign Application Priority Data

Jun. 11, 2014 (JP) .................. 2014-120790
Jul. 23, 2014 (JP) .................. 2014-149427
Sep. 30, 2014 (JP) .................. 2014-199546

(51) Int. Cl.
*G01R 33/02* (2006.01)
*G07D 7/04* (2016.01)
*G01R 33/09* (2006.01)

(52) U.S. Cl.
CPC ............... *G07D 7/04* (2013.01); *G01R 33/09* (2013.01)

(58) Field of Classification Search
CPC .......... G01D 7/04; G01D 5/145; G01D 5/147; G01D 5/12; G01D 5/14; G01D 5/16;
(Continued)

(56) References Cited

U.S. PATENT DOCUMENTS 5,512,822 A *   4/1996   Masuda ................. G06K 7/087
                                                                                                 209/569
5,644,226 A      7/1997   Aoyama et al.
(Continued)

FOREIGN PATENT DOCUMENTS

JP         1-136071 A      5/1989
JP         6-180305 A      6/1994
(Continued)

OTHER PUBLICATIONS

International Search Report dated Aug. 11, 2015 in PCT/JP2015/066574 filed Jun. 9, 2015.
(Continued)

*Primary Examiner* — Thang Le
(74) *Attorney, Agent, or Firm* — Oblon, McClelland, Maier & Neustadt, L.L.P.

(57) ABSTRACT

A magnetic sensor device includes: a magnet; yokes arranged on the magnet; and a magnetoresistance effect element to which is applied a leakage magnetic field emitted from the yokes to an exterior thereof. A detection region of the magnetoresistance effect element is at the side opposite to the magnet. The magnetoresistance effect element detects a change of a bias magnetic field of the magnetoresistance effect element that occurs when the object to be detected including the hard magnetic material passes through the detection region. The magnetic sensor device can accurately detect an object to be detected using a hard magnetic material.

19 Claims, 29 Drawing Sheets

(58) Field of Classification Search
CPC .. G01D 5/2457; G01D 5/2013; G01D 5/2046; G01R 33/0206; G01R 33/06; G01R 33/063; G01R 33/09; G01R 33/093; G01R 33/0052; G01R 33/18; G01P 1/026; G01P 3/66; G01P 3/68; G01P 3/665; G01P 3/443; G01P 3/488; G01P 3/487; G01P 3/481; G01P 3/685; G01B 7/30; G01B 7/003; G01B 7/14; G01N 27/903
USPC ................ 324/173–174, 178–179, 161, 162, 324/207.11–207.26, 259
See application file for complete search history.

(56) References Cited

U.S. PATENT DOCUMENTS

| | | | |
|---|---|---|---|
| 6,310,475 B1* | 10/2001 | Kawase | G01D 5/145 194/317 |
| 2003/0102860 A1* | 6/2003 | Haji-Sheikh | G01D 5/145 324/174 |
| 2003/0173955 A1* | 9/2003 | Uenoyama | G01D 5/142 324/207.21 |
| 2011/0248705 A1* | 10/2011 | Matsumoto | G01D 5/145 324/207.2 |
| 2013/0119980 A1* | 5/2013 | Ogomi | G01R 33/091 324/252 |
| 2013/0127457 A1* | 5/2013 | Musha | B82Y 25/00 324/252 |
| 2014/0097833 A1* | 4/2014 | Kusumi | G01D 9/10 324/207.25 |
| 2015/0102808 A1 | 4/2015 | Ogomi et al. | |

FOREIGN PATENT DOCUMENTS

| | | |
|---|---|---|
| JP | 7-294540 A | 11/1995 |
| JP | 2000-39472 A | 2/2000 |
| JP | 2006-266862 A | 10/2006 |
| JP | 2006-317218 A | 11/2006 |
| JP | 2008-145379 A | 6/2008 |
| JP | 2013-206439 A | 10/2013 |
| JP | 2013-217768 A | 10/2013 |
| WO | 2013/146755 A1 | 10/2013 |

OTHER PUBLICATIONS

Office Action dated Jun. 6, 2017 in Japanese Patent Application No. 2016-527813 (with English translation).

* cited by examiner

FIG. 7A            FIG. 7B            FIG. 7C
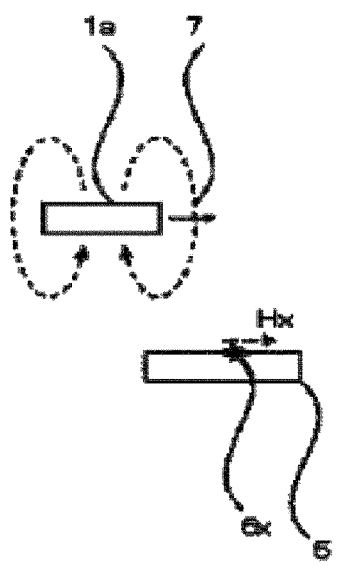
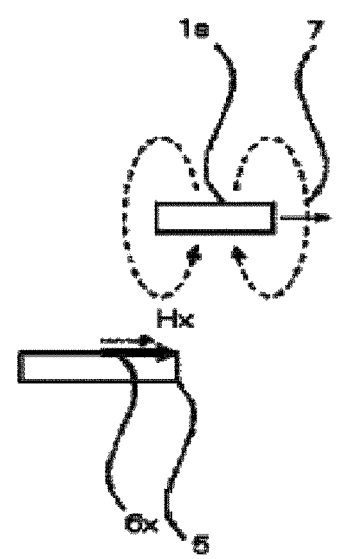
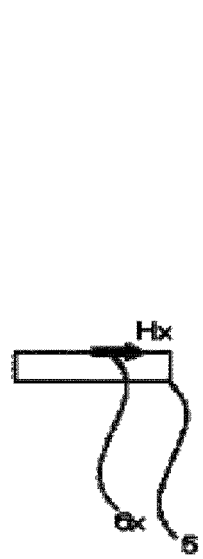
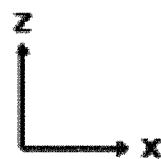

MAGNETIC SENSOR DEVICE

TECHNICAL FIELD

The present disclosure relates to a magnetic sensor device for detection of a magnetic material (magnetic component) included in a sheet-like object to be detected.

BACKGROUND ART

Conventional magnetic sensor devices exist that are composed of a substrate, on which a magnetoresistance effect element (magnetoresistive element) is formed, and a magnet for applying a bias magnetic field to the magnetoresistance effect element (for example, see Patent Literatures 1 and 2). Patent Literature 1 discloses a magnetic sensor device in which position of a permanent magnet is adjusted such that a bias magnetic field strength of a magnetosensitive direction of a ferromagnetic thin film magnetoresistive element becomes a magnetic flux amount less than or equal to a saturation magnetic field. Patent Literature 2 discloses arrangement of two magnetoresistance effect elements on a substrate, disposal of the magnetoresistance effect elements and the substrate within a body case, and disposal of a permanent magnet on the backside face of the body case.

Moreover, among conventional magnetic sensor devices, there exist magnetic sensor devices in which the magnetoresistance effect element is formed upon a magnetic material carrier, and a bias magnet and the magnetic material carrier oppose one another and sandwich a conveyance path of the object to be detected (for example, see Patent Literature 3). Among conventional magnetic sensor devices, there exist magnetic sensor devices that use a single detector to detect both a soft magnetic material included in the object to be detected and a hard magnetic material included in the object to be detected (for example, see Patent Literature 4).

CITATION LIST

Patent Literature

Patent Literature 1: Unexamined Japanese Patent Application Kokai Publication No. 2008-145379 (particularly FIGS. 3 to 6)
Patent Literature 2: Unexamined Japanese Patent Application Kokai Publication No. 2006-317218 (particularly FIG. 9)
Patent Literature 3: Unexamined Japanese Patent Application Kokai Publication No. 2013-217768 (particularly FIGS. 1, 6 and 8)
Patent Literature 4: International Publication No. WO2013-146755 (particularly FIGS. 2 and 13)

SUMMARY OF INVENTION

Technical Problem

A magnetic sensor device using a magnetoresistance effect element detects a magnetic material by use of a change of resistance value of a magnetoresistance effect element due to change of bias magnetic field due to a magnetic material such as a magnetic ink and the like. The magnetic material that is the object to be detected includes soft magnetic materials and hard magnetic materials. When using the magnetic sensor devices such as those disclosed in Patent Literatures 1, 2 and 3, soft magnetic material is detected even when the detection of hard magnetic material is attempted, and thus such magnetic sensor devices have a problem in that detection of just the hard magnetic material can be difficult.

Detection of hard magnetic material becomes difficult due to saturation of magnetic output for both the soft magnetic material and the hard magnetic material, due to application of an excessively strong bias magnetic field to the object to be detected, so there is no difference in output. Further, although the magnetic sensor device disclosed in FIG. 2 of Patent Literature 4 is disclosed as using a magnetoresistance effect element for detection of just hard magnetic material, there is no disclosure of the relationship between the magnetoresistance effect element and the bias magnetic field for the magnetoresistance effect element.

Objects of the present disclosure are to solve the aforementioned type of problems and to obtain a magnetic sensor device for highly accurate detection of an object to be detected that uses a hard magnetic material.

Solution to Problem

The magnetic sensor device of the present disclosure includes a magnetoresistance effect element to which is applied a leakage magnetic field released to the exterior of a yoke from the yoke, the yoke being installed on a magnet. This magnetoresistance effect element uses as the detection region the side of the magnetoresistance effect element that is opposite to the magnet. The magnetoresistance effect element detects a change of bias magnetic field of the magnetoresistance effect element that occurs when an object to be detected including hard magnetic material passes through the detection region.

Advantageous Effects of Invention

The magnetic sensor device of the present disclosure uses as a bias magnetic field a leakage magnetic field released to the outside of a yoke, and thus there is no saturation of the magnetoresistance effect element, and the magnetoresistance effect element is able to detect with high accuracy an object to be detected that includes hard magnetic material.

BRIEF DESCRIPTION OF DRAWINGS

FIGS. 7A-7C are diagrams illustrating change of magnetic field for description of principles of detection of the magnetic sensor device of Embodiment 2 of the present disclosure.

DESCRIPTION OF EMBODIMENTS

In the present disclosure, a conveyance direction 2 of an object to be detected 1 is taken to be the X direction. The longitudinal direction orthogonal to the conveyance direction 2 (X direction) is taken to be the Y direction. The direction orthogonal to both the conveyance direction 2 and the longitudinal direction (direction perpendicular to the conveyance direction 2) is taken to be the Z direction. Magnetoresistance effect elements 5 extend linearly in the longitudinal direction (Y direction). Moreover, the X direction is a direction along the X axis, the Y direction is a direction along the Y axis, and the Z direction is a direction along the Z axis. These X axis, Y axis and Z axis are designated by X, Y and Z in the figures. Although not illustrated, the origin of the X axis, Y axis and Z axis is taken to be the central portion of the magnetoresistance effect elements 5. In cases in which a plus or minus symbol (+, −) is appended before the X direction, Y direction, or Z direction, the plus or minus symbol indicates the direction from the origin.

Embodiment 1

Figure 1A:
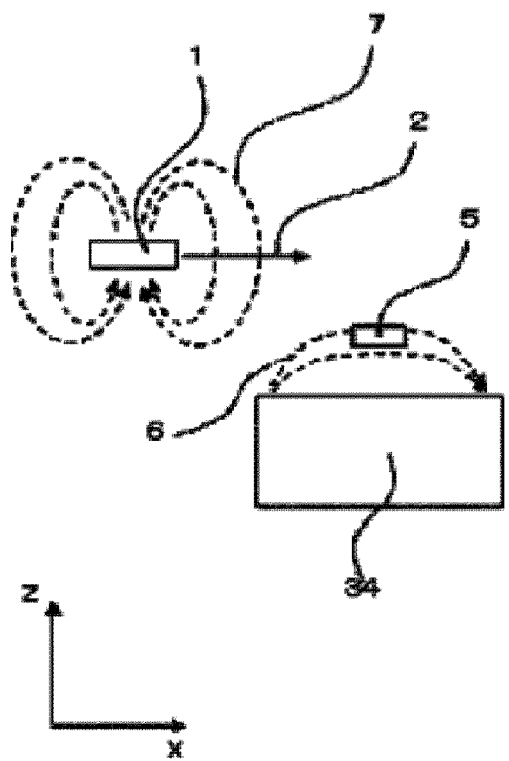
FIGS. 1A and 1B are configuration diagrams of a magnetic sensor device of Embodiment 1 of the present disclosure.
Figure 1B:
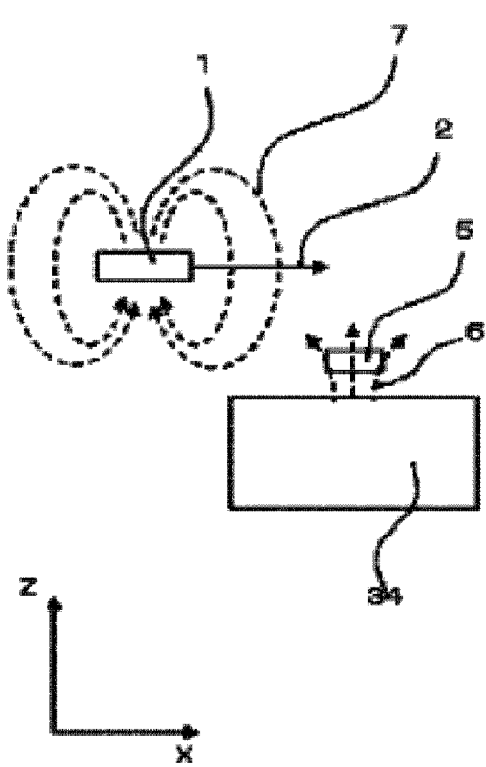

Figures are used to describe a magnetic sensor device of Embodiment 1 of the present disclosure. FIG. 1A is a configuration diagram of the magnetic sensor device of Embodiment 1. The leakage magnetic field arising from the yoke-attached magnet 34 is nearly parallel to the conveyance direction 2 (X direction) at the magnetoresistance effect elements 5. FIG. 1B is a configuration diagram of the magnetic sensor device of Embodiment 1. The leakage magnetic field arising from the yoke-attached magnet 34 is nearly parallel to the Z direction at the magnetoresistance effect elements 5.

In FIG. 1, the object to be detected 1 is paper currency, a check, and the like, on which is printed a image, pattern, or lettering using an ink and the like of a hard magnetic material. The object to be detected 1 has at least a hard magnetic material 1a. That is to say, the object to be detected 1 may include only the hard magnetic material 1a, or alternatively, may also include a soft magnetic material. A conveyance path 2 is a path of conveyance of the object to be detected 1, and the direction of the arrow is the conveyance direction 2 (X direction) of the object to be detected 1. In the conveyance path 2, a region in which the hard magnetic material 1a of the object to be detected 1 detected by the magnetoresistance effect elements 5 is a detection region 2a. The detection region 2a is a region on the conveyance path 2 at the side of the magnetoresistance effect elements 5 that is opposite to the magnet 3. When the object to be detected 1 is conveyed to the detection region 2a, components are arranged in the following order in the Z direction from the yoke-attached magnet 34: yoke-attached magnet 34, magnetoresistance effect elements 5 and object to be detected 1. The detection region 2a is not illustrated. The yoke-attached magnet 34 comprises a magnet 3 and a yoke 4. Further, the magnet 3 has a N pole and a S pole as mutually opposite magnetic poles. The yoke 4 is arranged so as to cover the magnet 3 and is formed from a magnetic material such as iron and the like.

In FIG. 1, the magnetoresistance effect elements 5 are arranged between the magnet 3 and the conveyance path 2.

The leakage magnetic field 6 is a leakage magnetic field released to the exterior of the yoke 4 from the yoke 4. The leakage magnetic field 6 released from the yoke-attached magnet 34 is released to the exterior of the yoke 4 from the yoke 4. In FIG. 1A, this field is nearly parallel to the X direction. In FIG. 1B, this field is nearly parallel to the Z direction. Moreover, the leakage magnetic field 6, as described in detail below, is used as the bias magnetic field of the magnetoresistance effect elements 5.

Figure 2:
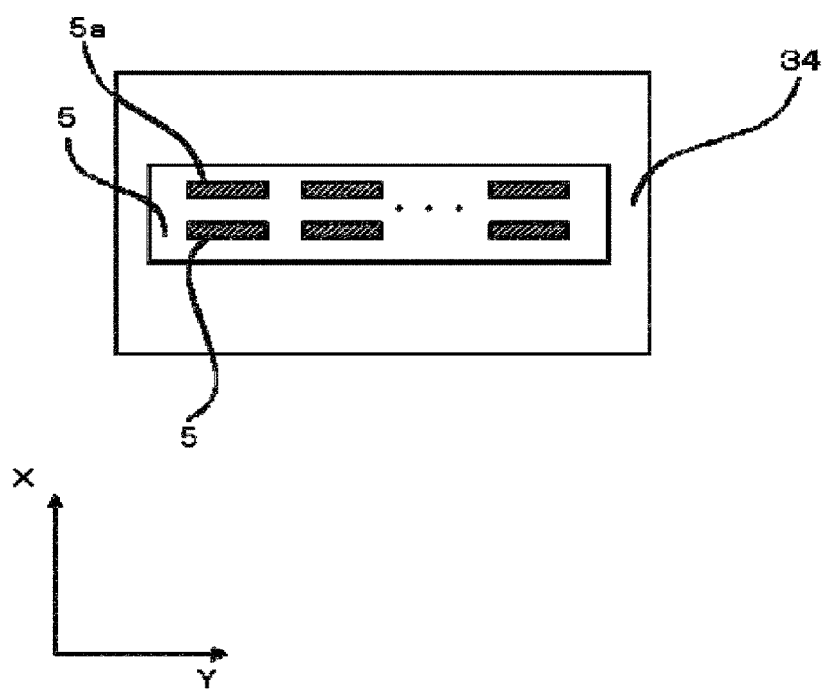
FIG. 2 is a top view of magnetoresistance effect elements in the magnetic sensor device of Embodiment 1 of the present disclosure, as viewed from above.

FIG. 2 is a top view of the magnetic sensor device of Embodiment 1. A bridge configuration of the magnetoresistance effect elements 5 is often generally used as a temperature-compensation countermeasure. The bridge configuration is used in the description of the present disclosure. Component elements 5a (first magnetoresistance effect elements 5a) are arrayed in the longitudinal direction and constitute a first array of the magnetoresistance effect elements 5. A plurality of component elements 5b (second magnetoresistance effect elements 5b) are arrayed in the longitudinal direction and constitute a second array of the magnetoresistance effect elements 5. The present disclosure discloses arrangement and ordering the component elements, in order, as the component elements 5b and the component elements 5a in the conveyance direction 2, although the configuration is not limited to such an order. In the magnetic sensor device of the present disclosure, the magnetoresistance effect elements 5 may be referred to as the magnetoresistance effect element group 5 (magnetoresistance effect element row 5), the component elements 5a may be referred to as the magnetoresistance effect element 5a, and the component elements 5b may be referred to as the magnetoresistance effect elements 5b.

Application of a magnetic field of an appropriate strength is required for allowing operation of the magnetoresistance effect elements 5, and such a magnetic field is referred to as a bias magnetic field 6. The component elements 5a and component elements 5b are connected to one another by bridging. That is to say, this connection produces the above described bridge configuration. In FIG. 1A, the resistance value changes during the magneto-response of the magnetoresistance effect elements 5 to the X-direction component, which is the component in the X direction of the bias magnetic field 6. In FIG. 1B, the resistance value changes during the magneto-response of the magnetoresistance effect elements 5 to the X-direction-tilted magnetic field at the Z-direction component, which is the component in the Z direction of the bias magnetic field 6.

Due to the desirability of detecting the magnetic field (hard magnetic material magnetic field) 7 generated from the hard magnetic material 1a, the bias magnetic field 6 is preferably hardly applied to the object to be detected 1 including the hard magnetic material 1a. Thus the utilized bias magnetic field 6 is applied to the magnetoresistance effect elements 5 as the leakage magnetic field 6 released to exterior of the yoke 4 from the yoke 4. The magnetoresistance effect elements 5 sense the change of the magnetic field with highest sensitivity during a state in which this bias magnetic field 6 is applied. The magnetoresistance effect elements 5 detect the change of bias magnetic field of the aforementioned magnetoresistance effect elements that occurs when the object to be detected 1, which includes the hard magnetic material 1a, passes through the detection region 2a, which is located at the side of the magnetoresistance effect elements 5 opposite to the magnet 3. Specifically, due to change of the bias magnetic field, the resistance value of the magnetoresistance effect elements changes, thereby enabling detection of the hard magnetic material 1a due to the change in the resistance value.

The hard magnetic material 1a of the object to be detected 1 is magnetized prior to arriving at the detection region 2a. The magnetized hard magnetic material 1a of the magnetized object to be detected 1 proceeds through the conveyance path 2 while forming a magnetic field (hard magnetic material magnetic field) 7 around the hard magnetic material 1a. That is to say, the object to be detected 1 proceeds through the detection region 2a in a state in which a magnetic field is generated by spontaneous magnetization. Further, the magnet used for magnetization of the object to be detected 1 (hard magnetic material 1a) may be formed at the interior of the magnetic sensor device of the present disclosure, or may be formed at the exterior of the magnetic sensor device. That is to say, any configuration is permissible as long as the object to be detected 1 is magnetized prior to arriving at the detection region 2a.

The change of the bias magnetic field 6 brought about by passage of the hard magnetic material 1a enables the detection of the passage of the hard magnetic material 1a. In the vicinity of the magnetoresistance effect elements 5, the yoke-attached magnet 34 applies almost no magnetic field to the object to be detected 1 such as paper currency and the like. Thus the magnetoresistance effect elements 5 do not sense a soft magnetic material that does not self-generate a magnetic field, thereby enabling the distinction between the hard magnetic material and the soft magnetic material. This ability is due to the positional relationships between the yoke 4, the magnetoresistance effect elements 5, and the detection region 2a satisfying the following condition. The state of positional relationships is explained below.

The condition of these positional relationships is that the change of bias magnetic field 6 of the magnetoresistance effect elements 5 that occurs due to the magnetic field due to spontaneous magnetization of the object to be detected 1 is greater than the change of bias magnetic field 6 of the magnetoresistance effect elements 5 that occurs due to application of the leakage magnetic field 6 from the yoke 4 to the object to be detected 1. The yoke 4, the magnetoresistance effect elements 5, and the detection region 2a are arranged at positions that satisfy this condition. As a result, a magnetic sensor device can be provided that is capable of reading the slight change of magnetic field that occurs due to the hard magnetic material 1a.

The arrangement of the yoke 4, magnetoresistance effect elements 5, and detection region 2a in the description of the arrangement of the magnetic sensor device of Embodiment 1 is the same for the magnetic sensor devices of Embodiments 2 to 11. The magnetic sensor devices of Embodiments 2 to 11 differ in the positional relationships between the magnet 3 and the yoke 4, and in the number of yokes 4. Further, the arrays of the magnetoresistance effect elements 5, component elements 5a, and component elements 5b are different. Alternatively, a soft magnetic material-sensing magnetic sensor device 10 may be added. The magnetic sensor device of the present disclosure can be a combination of any of the magnetic sensor devices of Embodiments 1 to 11 that is consistent with the scope of the magnetic sensor device of the present application.

Configuration in the aforementioned manner enables the providing of a magnetic sensor device that is capable of high-sensitivity detection of the hard magnetic material, with hardly any sensitivity toward the soft magnetic material, and thus the magnetic sensor device is capable of distinguishing between the hard magnetic material and the soft magnetic material.

Embodiment 2

Figure 3:
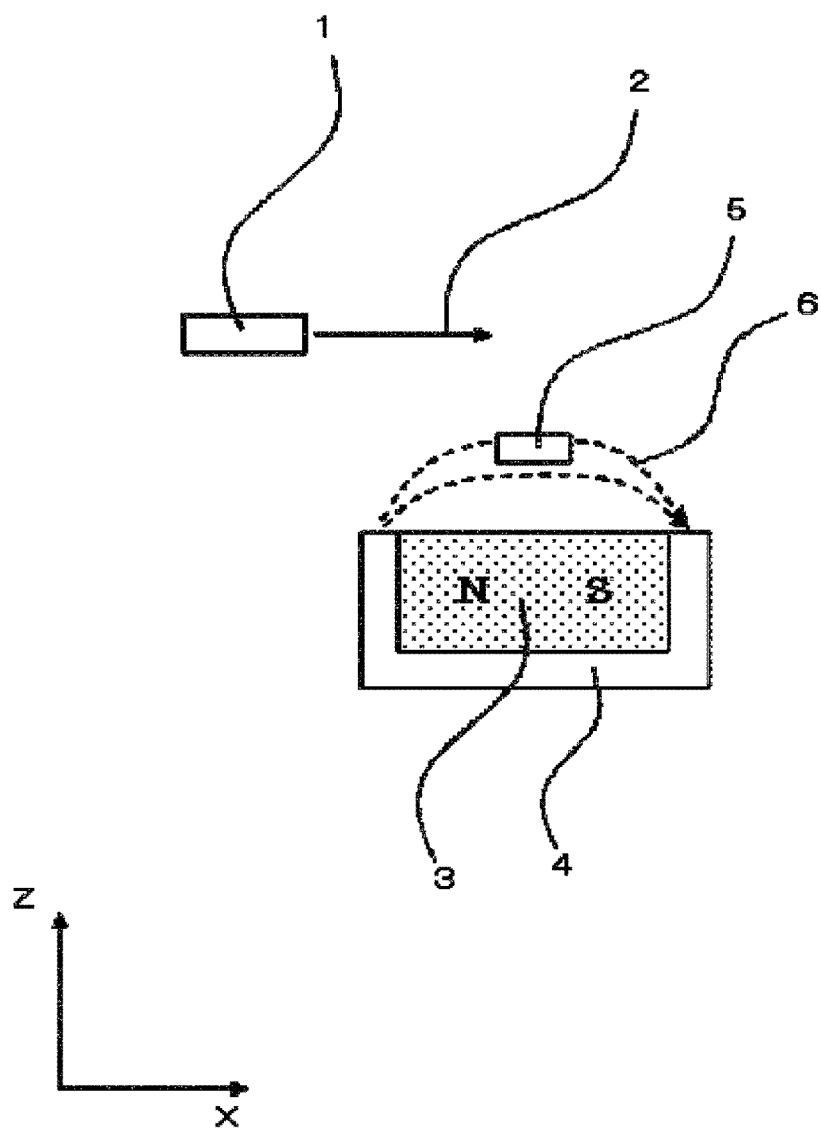
FIG. 3 is a configuration diagram of a magnetic sensor device of Embodiment 2 of the present disclosure.

Figures are used to describe a magnetic sensor device of Embodiment 2 of the present disclosure. FIG. 3 is a configuration diagram of the magnetic sensor device of Embodiment 2. In FIG. 3, constituent elements that are the same or equivalent to those of FIGS. 1A and 1B are assigned the same reference signs, and descriptions of such constituent elements are omitted. The magnet 3 has mutually different magnetic poles in the conveyance direction (X direction), an N pole and an S pole. That is to say, the magnetic poles of the magnet 3 are arranged along the conveyance direction 2, which is the direction of passage of the object to be detected 1. As viewed in a plane (X-Z plane) extending in the conveyance direction, the yoke 4 is arranged so as to cover the magnet 3 except at a portion of the magnet 3 opposing the conveyance path 2, and the yoke 4 is formed of a magnetic material such as iron and the like. That is to say, the yoke 4 is formed at each of the magnetic pole end portions, the forward end and the rearward end, of the magnet 3 in the conveyance direction 2.

The magnetoresistance effect elements 5 are arranged, between the N and S poles of the magnet 3, between the magnet 3 and the conveyance path 2 of the object to be detected 1. That is to say, in the detection region 2a, the object to be detected 2 including the hard magnetic material 1a is arranged at the side of the magnetoresistance effect elements 5 opposite to the magnet 3. In FIG. 3, the magnetoresistance effect elements 5 are arranged at the center portion between the N and S poles of the magnet 3. Specifically, the magnetoresistance effect elements 5 are arranged on a virtual line orthogonal to the leakage magnetic field 6 at a central portion in the conveyance direction 2 of the yoke 4 formed at both the forward end and the rearward end of the magnet 3. This virtual line is not illustrated. The leakage magnetic field 6 is released from the yoke at the N pole-end of the magnet 3 and is directed toward the S pole-end yoke of the magnet 3. That is to say, the leakage magnetic field is generated between the yoke at the N pole-end of the magnet 3 and the S pole-end yoke of the magnet 3, and is nearly parallel to the conveyance direction (X direction). Moreover, as explained below in detail, the leakage magnetic field 6 acts as the bias magnetic field 6 of the magnetoresistance effect elements 5 in the same manner as in Embodiment 1.

Figure 4:
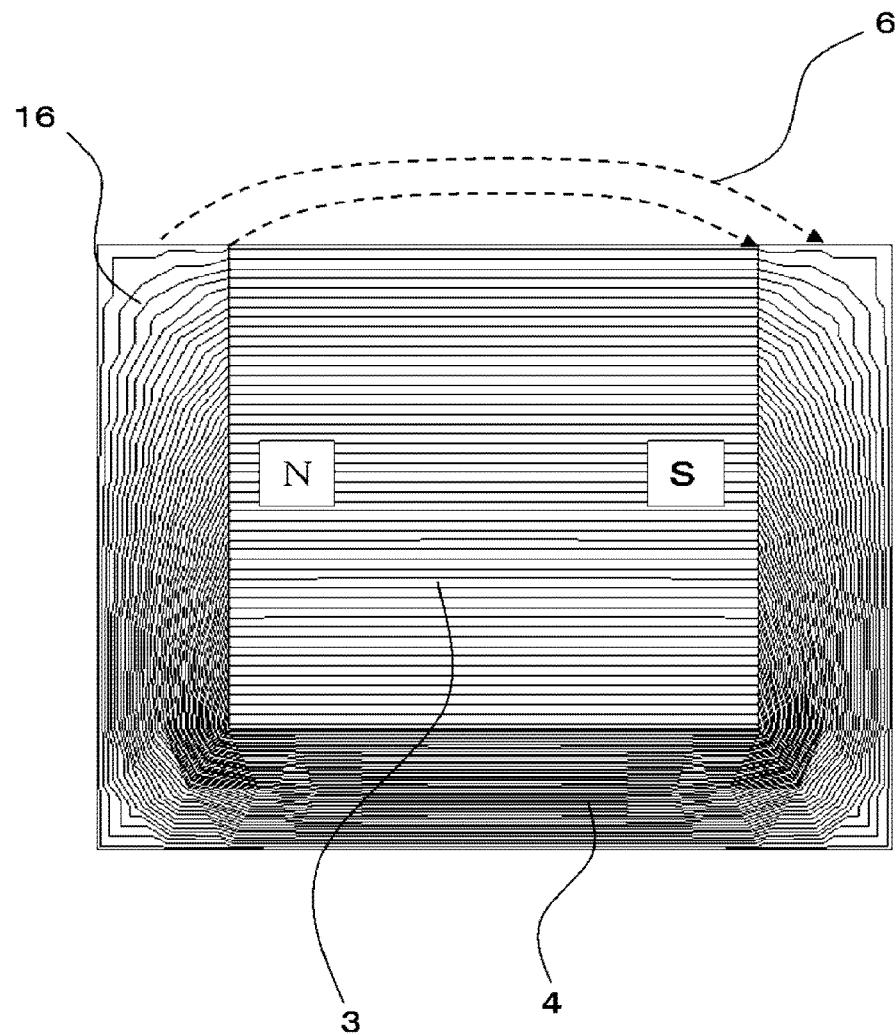
FIG. 4 is a diagram for description of a magnetic field formed by the magnet 3 and the yoke 4 of the magnetic sensor device of Embodiment 2 of the present disclosure.

FIG. 4 is used in description of the bias magnetic field 6. FIG. 4 is a diagram for description of the magnetic field formed by the magnet 3 and the yoke 4 of the magnetic sensor device of Embodiment 2. In FIG. 4, the magnetic field generated from the N pole of the magnet 3 passes through the interior of the yoke 4 and enters the S pole of the magnet 3. When the surroundings of the magnet 3 are covered by the yoke 4 in this manner, the magnetic field is concentrated in the yoke 4. However, as illustrated in FIG. 4, due to the lack of the yoke 4 at the position opposing the conveyance path 2, the leakage magnetic field 6 is released, although slightly, into space. That is to say, there exists the leakage magnetic field 6, released to the exterior of the yoke 4, that is generated from the N pole-side of the "yoke" of the magnet 3 to the S pole-side of the "yoke" of the magnet 3. In Embodiment 2, this minute leakage magnetic field 6 is used as the bias magnetic field 6.

Figure 5:
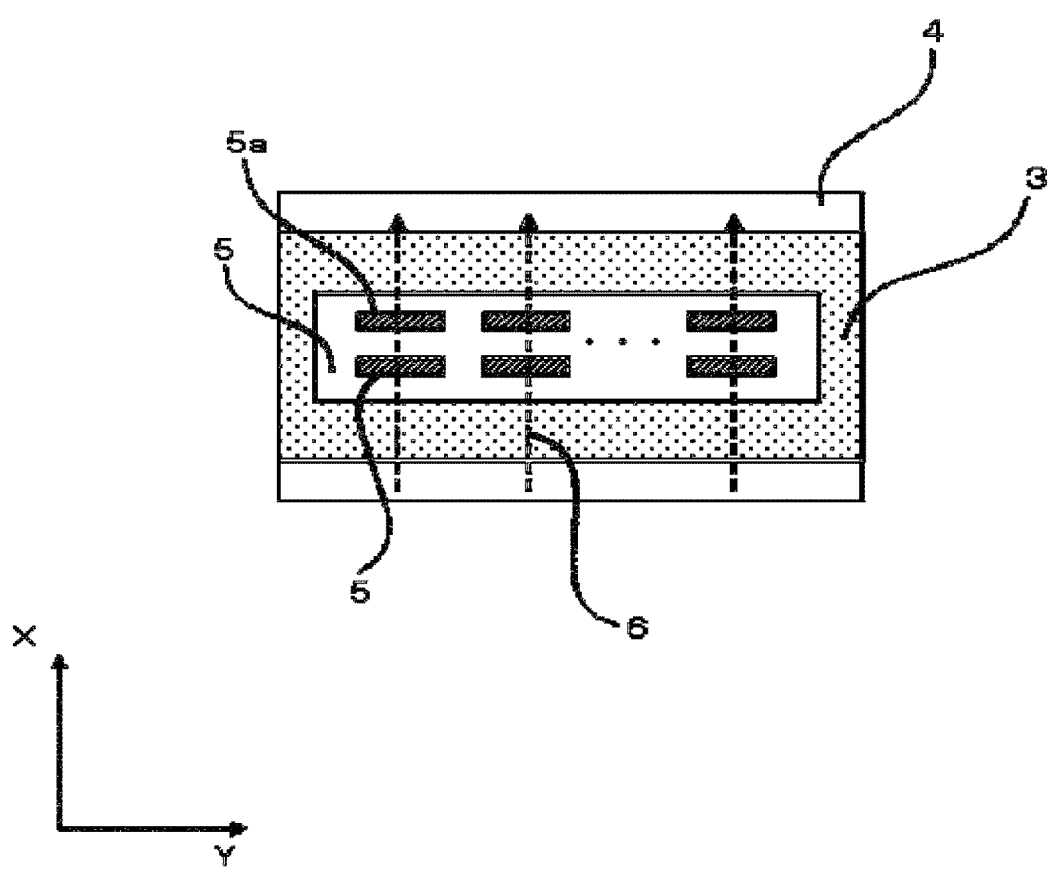
FIG. 5 is a top view of magnetoresistance effect elements in the magnetic sensor device of Embodiment 2 of the present disclosure, as viewed from above.

FIG. 5 is a view of the top surface of the magnetic sensor device of Embodiment 2 of this description. In FIG. 5, constituent elements that are the same or equivalent to those of FIG. 2 are assigned the same reference signs, and descriptions of such constituent elements are omitted. In order to allow operation of the magnetoresistance effect elements 5, application of a magnetic field of the appropriate strength in the X direction is required as the bias magnetic field 6. The bias magnetic field 6 is an extremely small magnetic field of about 2 mT (milli Tesla). The magnetic field is preferably barely applied to the hard magnetic material 1a object to be detected 1, and thus the yoke 4 is effective for shielding three surfaces of the magnet 3. The magnetoresistance effect elements 5 detect the change of the magnetic field with greatest sensitivity when in the state in which this bias magnetic field 6 is applied.

Figure 6:
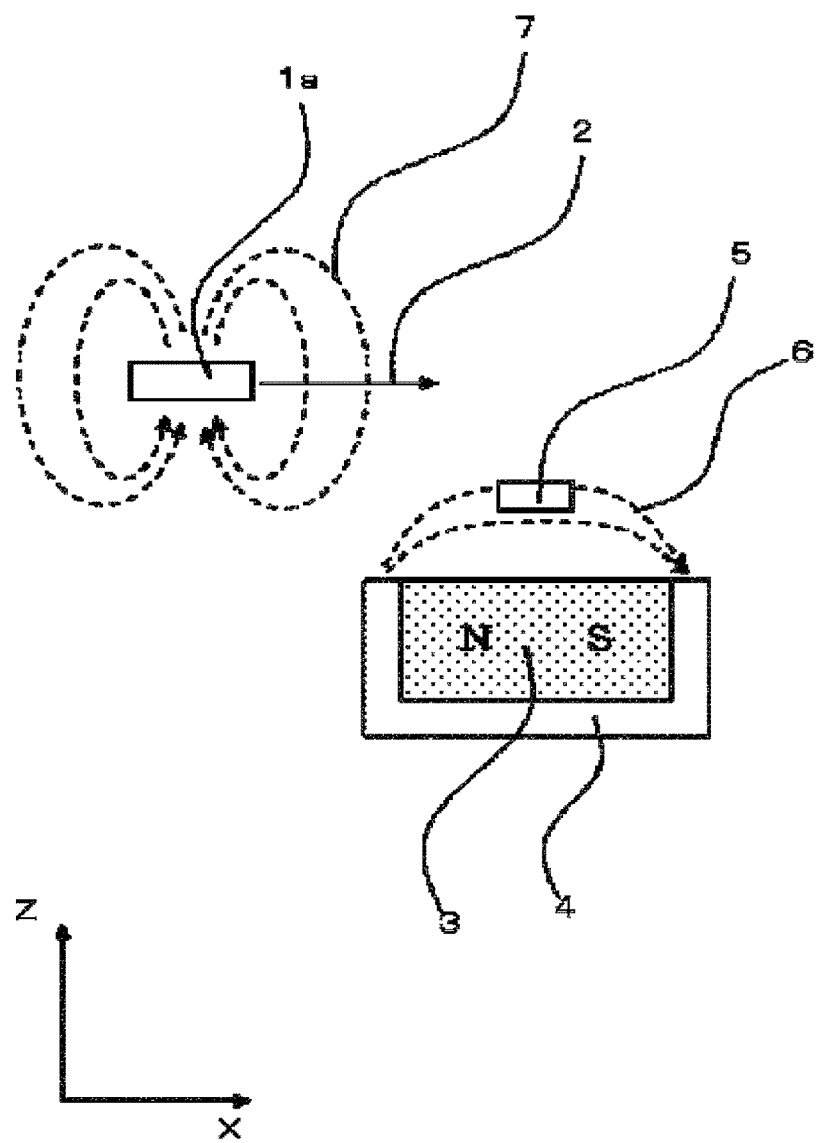
FIG. 6 is a diagram illustrating operation during detection by the magnetic sensor device of Embodiment 2 of the present disclosure.

Operation of the magnetic sensor device is explained below. FIG. 6 is a diagram illustrating the operation of detection by the magnetic sensor device of Embodiment 2. In FIG. 6, constituent elements that are the same or equivalent to those of FIGS. 1A and 1B are assigned the same reference signs, and descriptions of such constituent elements are omitted. In FIG. 6, distribution of the bias magnetic field 6 at the position where the magnetoresistance effect elements 5 are arranged is imparted a change when the hard magnetic material magnetic field 7 approaches the magnetoresistance effect elements 5, and thereafter when the hard magnetic material magnetic field 7 becomes distant. The magnet 3 and yoke 4 in the aforementioned manner impart to the magnetoresistance effect elements 5 a bias magnetic field 6 that is suitable for operation, thus enabling highly sensitive sensing of change of the bias magnetic field 6 due to the hard magnetic material 1a.

FIGS. 6 and 7 are used for further detailed description. FIG. 7 is a diagram showing changes of magnetic field for description of principles of detection of the magnetic sensor device of Embodiment 2. As illustrated in FIG. 6, the main component of the magnetic field 6 in the vicinity of where the magnetoresistance effect elements 5 are arranged is parallel to the conveyance path. The X-direction component of this magnetic field 6 is used as the bias magnetic field 6 of the magnetoresistance effect elements 5. This is taken to be the X-direction component 6x of the bias magnetic field 6.

FIG. 7A illustrates the magnitude and direction of the X-direction component Hx of the bias magnetic field 6 when there is no hard magnetic material 1a. When the hard magnetic material 1a approaches the detection region 2a, as illustrated in FIG. 7B, the X-direction component Hx of the bias magnetic field 6 becomes directed in the opposite direction of the X-direction component of the magnetic field 7 of the hard magnetic material 1a. Thus the bias magnetic field 6 (Hx) applied to the magnetoresistance effect elements 5 becomes small. When the hard magnetic material 1a becomes separated from the detection region 2a, as illustrated in FIG. 7C, the X-direction component Hx of the bias magnetic field 6 becomes directed in the same direction as the X-direction component of the magnetic field 7 of the hard magnetic material 1a. Thus the bias magnetic field 6 (Hx) applied to the magnetoresistance effect elements 5 becomes large. Thus the resistance value of the magnetoresistance effect elements 5, which are magnetosensitive to X-direction component, changes, enabling the magnetoresistance effect elements 5 to sense the hard magnetic material 1a. That is to say, magnitude of the conveyance direction (X-direction) bias magnetic field 6 (Hx) changes due to passage of the hard magnetic material 1a (object to be detected 1), and thus the resistance value of the magnetoresistance effect elements 5 having magnetic sensitivity for the X-direction component changes, enabling sensing of the hard magnetic material 1a. In FIGS. 7B and 7C, the dashed-line arrow parallel to the bias magnetic field 6 indicates magnitude of the bias magnetic field 6 in FIG. 7A.

That is to say, this change of the bias magnetic field 6 occurs due to passage of the hard magnetic material 1a, and thus this configuration enables sensing of the passage of the hard magnetic material 1a. Thus a magnetic sensor device can be provided that is capable of reading slight changes of the magnetic field due to the hard magnetic material 1a. Further, due to configuration of the magnetic sensor device in this manner, in the vicinity of the magnetoresistance effect elements 5, hardly any magnetic field is applied by the magnet 3 and yoke 4 to the object to be detected 1 (hard magnetic material 1a) such as paper currency and the like. Even when the object to be detected 1 includes a soft magnetic material that does not self-generate a magnetic field, the soft magnetic material is not detected, thereby enabling distinction between the hard magnetic material and soft magnetic material.

Configuration in the aforementioned manner enables the providing of a magnetic sensor device that is capable of high-sensitivity detection of the hard magnetic material 1a, with hardly any sensitivity toward the soft magnetic material, and thus the magnetic sensor device is capable of distinguishing between the hard magnetic material and the soft magnetic material.

Embodiment 3

Figure 8:
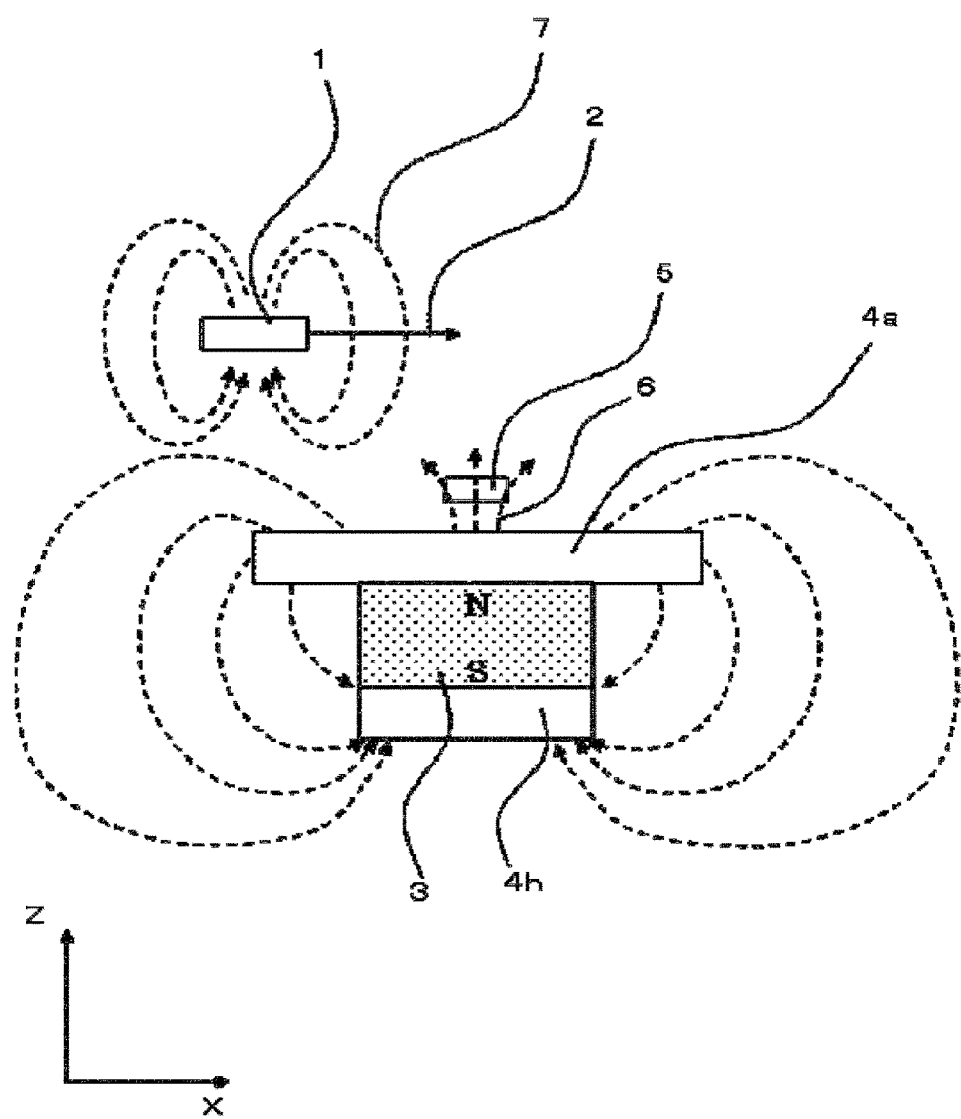
FIG. 8 is a configuration diagram of a magnetic sensor device of Embodiment 3 of the present disclosure.

Figures are used to describe a magnetic sensor device of Embodiment 3 of the present disclosure. FIG. 8 is a configuration diagram of the magnetic sensor device of Embodiment 3. In FIG. 8, constituent elements that are the same or equivalent to those of FIG. 3 are assigned the same reference signs, and descriptions of such constituent elements are omitted. In FIG. 8, the magnet 3 has N and S magnetic poles that are mutually different in a direction (Z direction) perpendicular to the conveyance direction 2. That is to say, for the magnet 3, the magnetic poles are arranged along the direction (Z direction) orthogonal to the conveyance direction 2, which is the direction of passage of the object to be detected 1.

The yoke 4a is arranged at a side surface along the conveyance direction 2 of the N pole side end of the magnet 3. That is to say, the yoke 4a is formed at the side surface of the magnet 3 that opposes the magnetoresistance effect elements 5. A yoke 4h is a second yoke. Thus the yoke 4a may be referred to as a first yoke. The yoke 4h is arranged so as to cover a side surface of the magnet along the conveyance direction 2 of the S pole end of the magnet 3. Further, length of the yoke 4h in the conveyance direction 2, or passage direction (X direction) is shorter than length of the yoke 4a in the X direction. That is to say, the yoke 4h is formed at the side of the magnet 3 opposite to the side of the magnet 3 opposing the magnetoresistance effect elements 5, and the X-direction length of the yoke 4h is shorter than the X-direction length of the yoke 4a. The length of the yoke 4a in the X direction becomes longer than the length of the magnet 3 in the X direction. The length of the yoke 4h in the X direction is the same as the length of the magnet 3 in the X direction. The magnetoresistance effect elements 5 are arranged in FIG. 8 at the conveyance direction 2 (X direction) width central portions of the yoke 4a at the N pole-side of the magnet 3 and the magnet 3, and are arranged between the yoke 4a and the conveyance path 2 of the object to be detected 1. That is to say, the magnetoresistance effect elements 5 are arranged on a virtual line extending in the Z direction, which is the direction of arrangement of the magnet 3 and the yoke 4a. This virtual line is not illustrated. Further, the central portion of the magnet 3, central portion of the yoke 4a, and the central portion of the effect element 5 coincide with one another in the X direction. Thus the central portions of the magnet 3, yoke 4a, and magnetoresistance effect elements 5 intersect the Z axis passing through the origin.

The bias magnetic field 6 is described below. X-direction length of the yoke 4a formed at the N pole-side end of the magnet 3 is longer than the X-direction length of the magnet 3. Thus the magnetic field generated from the N pole of the magnet 3 propagates in the positive and negative conveyance direction 2 through the yoke 4a. Due to this propagation, the magnetic field distribution of the propagation path to the magnet 3 S pole and yoke 4h from both conveyance direction 2 end portions of the yoke 4a, and from both conveyance direction 2 end portions of the magnet 3 S pole-side surface of the yoke 4a, becomes dominating. In this manner, the magnetic field from both conveyance direction 2 ends of the yoke 4a toward the magnet 3 S pole and the yoke 4h formed on the S pole side becomes dominant. Thus the magnetic field released from the magnetic pole (N pole), exceeding the yoke 4a, and released in the perpendicular direction (Z direction) from the conveyance path 2 sides of the yoke 4a is not dominant. Thus the magnetic field released in the Z direction becomes small. This minute magnetic field perpendicular to the conveyance direction 2 is used as the bias magnetic field 6. The minute magnetic field can be obtained even if the X-direction lengths of the yoke 4a and the yoke 4h are the same. However, setting the yoke 4a longer than the yoke 4h as illustrated in FIG. 8 enables further reduction of the magnetic field released in the Z direction. That is to say, the bias magnetic field 6 can be made smaller as the X-direction length of the yoke 4a is increased relative to the yoke 4h.

Figure 9:
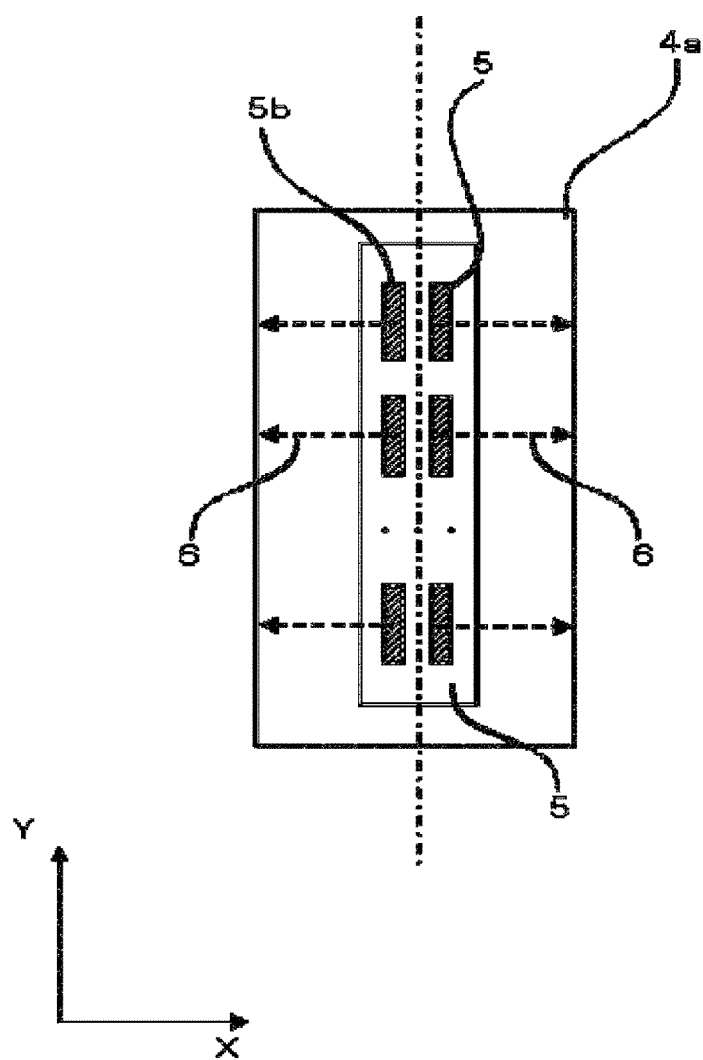
FIG. 9 is a top view of magnetoresistance effect elements in the magnetic sensor device of Embodiment 3 of the present disclosure, as viewed from above.

FIG. 9 is a top view of the magnetic sensor device of Embodiment 3. The component elements 5a and the component elements 5b are arranged in the conveyance direct 2 central portion of the magnetic 3 and are arranged symmetrically relative to the Y axis passing though the origin. The X-direction-tilted magnetic field of the Z-direction component, which is the component of the bias magnetic field 6 in the Z direction, is shown as acting as the bias magnetic field 6 in the +X direction for the component elements 5a and in the −X direction for the component elements 5b.

Figures 10A, 10B, 10C:
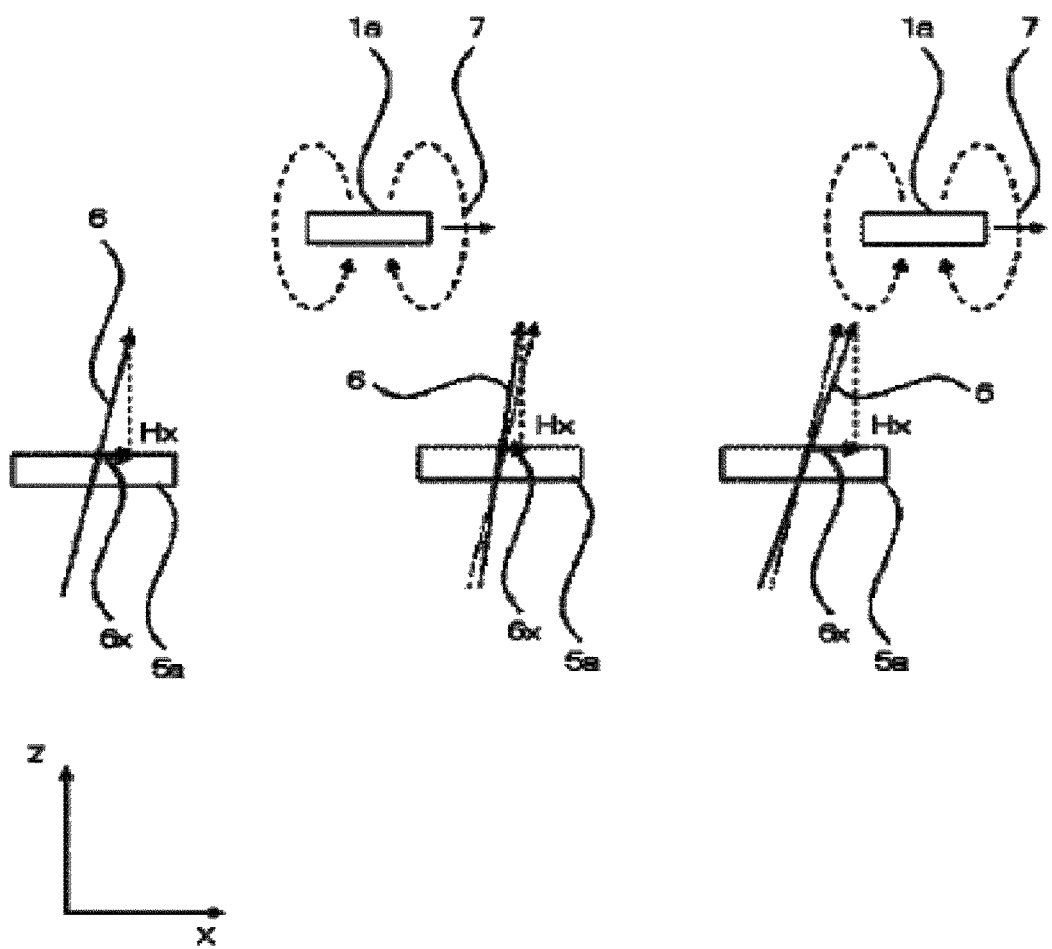
FIGS. 10A-10C are diagrams illustrating operation during detection by the magnetic sensor device of Embodiment 3 of the present disclosure.

Details of operation are described using FIGS. 8, 9 and 10. FIG. 10 is a diagram illustrating detection by the magnetic sensor device of Embodiment 3. In FIG. 10, although the Z direction component perpendicular to the conveyance path 2 becomes the main component of the magnetic field 6 in the vicinity of where the magnetoresistance effect elements 5 arranged, the first magnetoresistance effect elements 5a and the second magnetoresistance effect elements 5b are displaced somewhat in the X direction from the central axis (Z axis passing through the origin). Thus as illustrated in FIG. 10A, the magnetic field 6 is tilted slightly in the conveyance direction (X direction) from the vertical direction (Z direction), and this X-direction component of the magnetic field acts as the bias magnetic field 6 of the magnetoresistance effect elements 5, and is referred to as the X-direction component 6x of the bias magnetic field.

Operation of the component element 5a is described below. Due to arrangement of the component element 5a displaced from the central axis toward the transport side (downstream side of the conveyance path 2 relative to the detection region 2a) of the hard magnetic material 1a, the bias magnetic field 6 is applied in the +X direction. When the hard magnetic material 1a approaches the detection region 2a, as illustrated in FIG. 10B, the direction of the X-direction component Hx of the bias magnetic field 6 is the opposite to the direction of the X-direction component of the hard magnetic material magnetic field 7 of the hard magnetic material 1a. Thus the bias magnetic field 6 tilts toward the hard magnetic material 1a, and the bias magnetic field 6 conveyance direction (X direction) component Hx becomes smaller. When the hard magnetic material 1a becomes separated from the detection region 2a, as illustrated in FIG. 10C, the direction of the X-direction component Hx of the bias magnetic field 6 is in the same direction as the direction of the X-direction component of the hard magnetic material magnetic field 7 of the hard magnetic material 1a. Thus the bias magnetic field 6 tilts toward the hard magnetic material 1a, as if pulled by the hard magnetic material 1a, and the bias magnetic field 6 conveyance direction (X direction) component Hx becomes larger. Due to the component Hx becoming larger, the resistance value of the magnetoresistance effect elements 5a sensing the X-direction component of the bias magnetic field 6 changes, and the hard magnetic material 1a can be detected. That is to say, magnitude of the conveyance direction (X direction) bias magnetic field 6 (Hx) changes due to passage of the hard magnetic material 1a (object to be detected 1), and thus resistance value of the magnetoresistance effect elements 5 magnetosensitive to the X direction component changes, and the hard magnetic material 1a can be detected. The dashed-line arrows intersecting the bias magnetic field 6 in FIGS. 10B and 10C indicate the position of the bias magnetic field 6 in FIG. 10A.

Due to arrangement of the component element 5b displaced from the central axis toward the feed side (upstream side of the conveyance path 2 relative to the detection region 2a) of the hard magnetic material 1a, the bias magnetic field 6 is applied in the −X direction. Thus this arrangement is different in that, when the hard magnetic material 1a approaches, the direction of the conveyance direction (X-direction) component Hx of the bias magnetic field 6 becomes larger, and the conveyance direction (X-direction) component Hx of the bias magnetic field 6 becomes smaller when the hard magnetic material 1a becomes separated. However, the detection operation of the hard magnetic material 1a is the same as the operation of the component element 5a.

That is to say, passage of the hard magnetic material 1a causes this change of the bias magnetic field 6, and thus this type of configuration enables detection of passage of the hard magnetic material 1a. As a result, a magnetic sensor device can be provided that is capable of reading the slight change of magnetic field that occurs due to the hard magnetic material 1a.

Configuration of the magnetic sensor device in this manner makes possible a further decrease of the magnetic field applied to the object to be detected 1 (hard magnetic material 1a) such as paper currency and the like by the magnet 3, yoke 4a and yoke 4h in the vicinity of the magnetoresistance effect elements 5. Even if a soft magnetic material that doesn't self-generate a magnetic field is included in the object to be detected 1, the detection level for the soft magnetic material is decreased, thereby enabling distinction between the hard magnetic material and the soft magnetic material. Moreover, due to the application of the bias magnetic field in opposite directions for the component elements 5a and the component elements 5b, in theory the obtained output becomes doubled for the present configuration.

Embodiment 4

Figure 11:
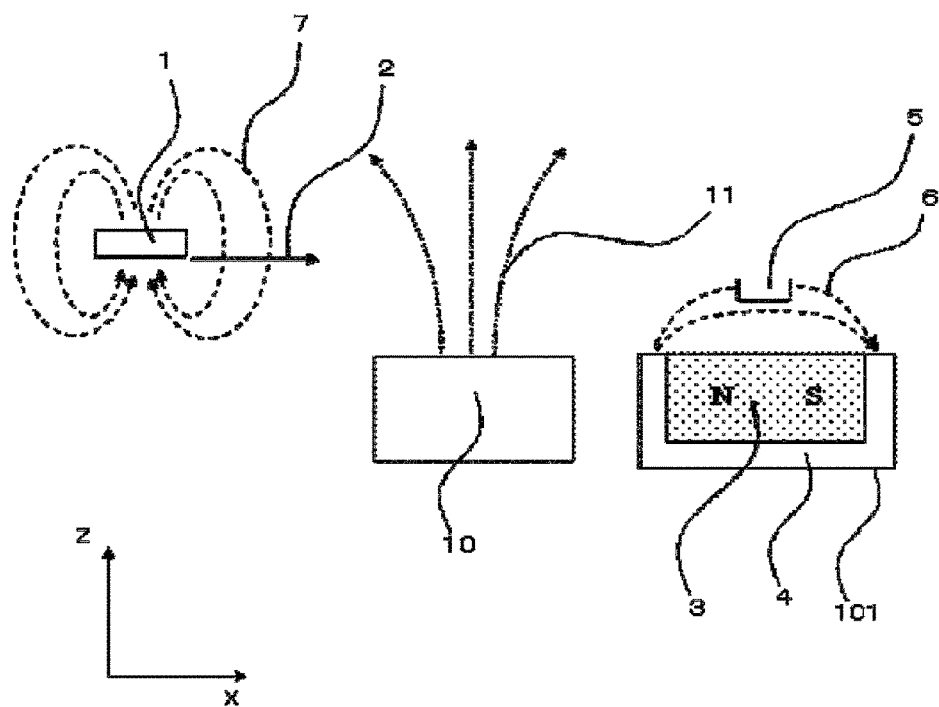
FIG. 11 is a configuration diagram of a magnetic sensor device of Embodiment 4 of the present disclosure.
Figure 13:
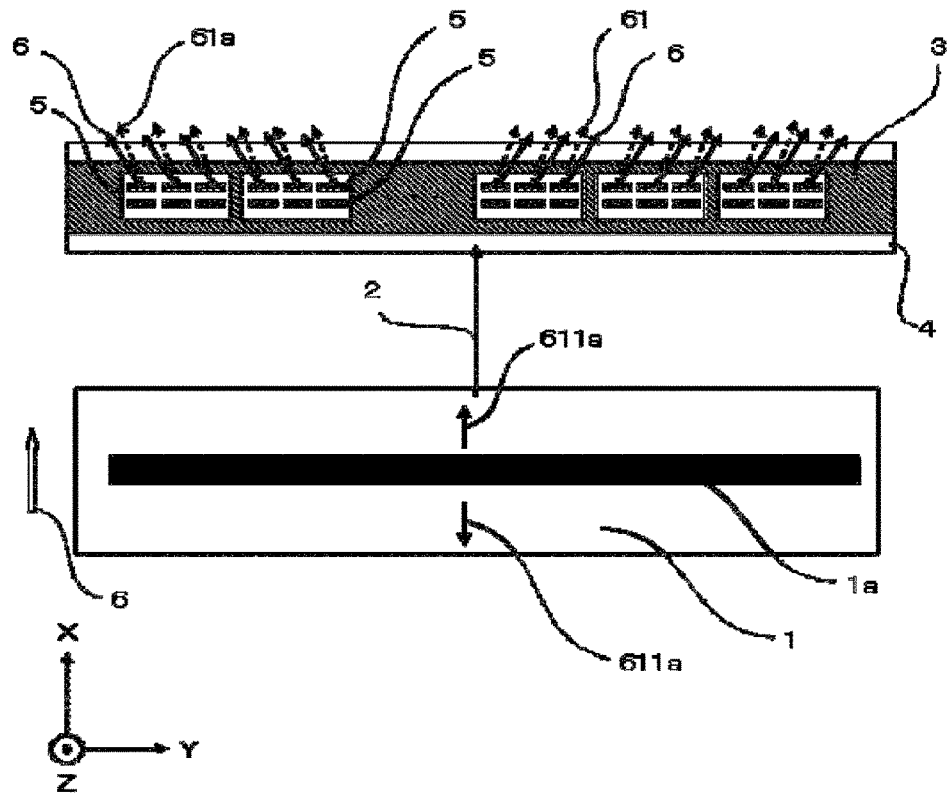
FIG. 13 is a diagram illustrating a top view of the magnetic sensor device of Embodiment 2, as viewed from above, for comparison with the magnetic sensor device of Embodiment 5 of the present disclosure, and illustrating bias magnetic field vectors applied to each of the magnetoresistance effect elements.

FIG. 11 is used to describe a magnetic sensor device of Embodiment 4 of the present disclosure. FIG. 11 is a configuration diagram of the magnetic sensor device of Embodiment 4. In FIG. 11, constituent elements that are the same or equivalent to those of FIG. 3 and FIG. 8 are assigned the same reference signs, and descriptions of such constituent elements are omitted. The soft magnetic material-sensing magnetic sensor device 10 in FIG. 11, is configured for detecting soft magnetic materials and includes, for example, a second magnetic sensor 20 and a second bias magnetic field magnet unit 32 as illustrated in FIG. 13 of Patent Literature 4. That is to say, even when the object to be detected 1 includes the soft magnetic material in addition to the hard magnetic material 1a, the magnetic sensor device of Embodiment 4 can detect the soft magnetic material by the soft magnetic material-sensing magnetic sensor device 10.

A magnetic field 11 illustrated in FIG. 11 is the bias magnetic field generated from the bias magnet of the soft magnetic material-sensing magnetic sensor device 10. The object of the soft magnetic material-sensing magnetic sensor device 10 is detection of the soft magnetic material. The soft magnetic material-sensing magnetic sensor device 10 thus uses the bias magnet to generate a strong magnetic field 11 in a detection region of the soft magnetic material-sensing magnetic sensor device 10 in the conveyance path 2. The soft magnetic material-sensing magnetic sensor device 10 uses a magnetoresistance effect element to detect disruption of the magnetic field by the soft magnetic material when the soft magnetic material passes through the detection region of the soft magnetic material-sensing magnetic sensor device 10.

In the magnetic sensor of Embodiment 4, the soft magnetic material-sensing magnetic sensor device 10 and the hard magnetic material-sensing magnetic sensor device 101 of Embodiment 2 are both arranged along the conveyance path 2. FIG. 11 illustrates the magnetic sensor device in which the detection region of the soft magnetic material-sensing magnetic sensor device 10 is arranged at a front stage in the conveyance path 2, and the detection region 2a is arranged at a rear stage.

The magnetic sensor device illustrated in FIG. 11 is configured such that the hard magnetic material 1a approaches a hard magnetic material-sensing magnetic sensor device 101 after passing through the strong magnetic field of the bias magnet of the soft magnetic material-sensing magnetic sensor device 10. In the magnetic sensor device configured in this manner, the soft magnetic material of the object to be detected 1 is magnetized during passage in the vicinity of the detection region of the soft magnetic material-sensing magnetic sensor device 10, and the soft magnetic material and the hard magnetic material 1a generate the magnetic field. The soft magnetic material-sensing magnetic sensor device 10 can detect the change of magnetic field due to the soft magnetic material and hard magnetic material 1a caused by arrival of the object to be detected at the detection region of the soft magnetic material-sensing magnetic sensor device 10. Further, the bias magnet of the soft magnetic material-sensing magnetic sensor device 10 functions as a hard magnetic material 1a magnetization magnet required for the detection of the hard magnetic material 1a by the hard magnetic material-sensing magnetic sensor device 101 arranged at the rear stage.

In the magnetic sensor device illustrated in FIG. 11, the hard magnetic material 1a of the object to be detected 1 is magnetized by passing through the vicinity of the detection region of the soft magnetic material-sensing magnetic sensor device 10, and the object to be detected approaches the detection region 2a of the hard magnetic material-sensing magnetic sensor device 101 in a state in which the hard magnetic material 1a self-generates a magnetic field. The hard magnetic material-sensing magnetic sensor device 101 can detect the change of magnetic field due to the hard magnetic material 1a detected by the magnetoresistance effect elements 5 due to arrival of the object to be detected 1 at the detection region 2a.

Due to configuration of the magnetic sensor device in this manner, the soft magnetic material is detected by only the soft magnetic material-sensing magnetic sensor device 10, and the hard magnetic material can be detected by both the soft magnetic material-sensing magnetic sensor device 10 and the hard magnetic material-sensing magnetic sensor device 101. This configuration enables distinction between the soft magnetic material and the hard magnetic material in the object to be detected 1.

Embodiment 5

Figure 12:
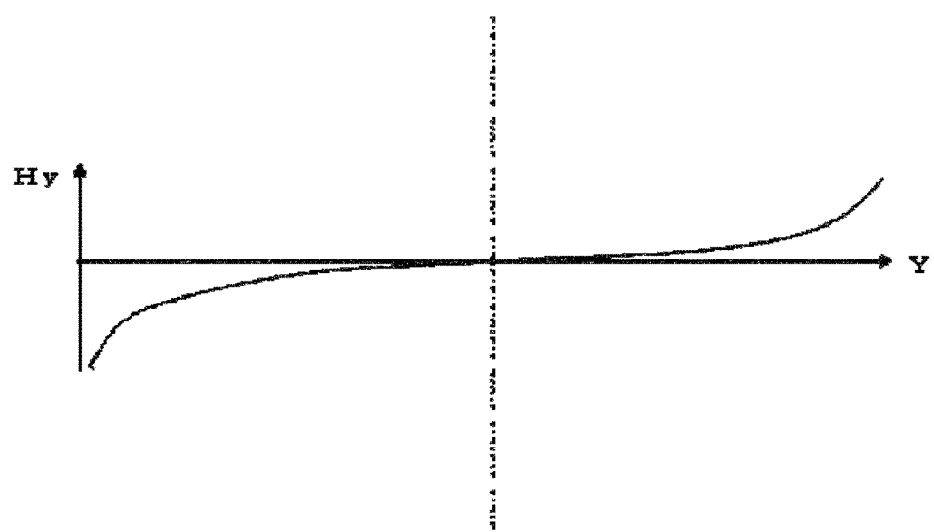
FIG. 12 is a graph illustrating a component Hy applied to the magnetoresistance effect elements of the magnetic sensor device of Embodiment 2 for comparison with the magnetic sensor device of Embodiment 5 of the present disclosure.
Figure 14:
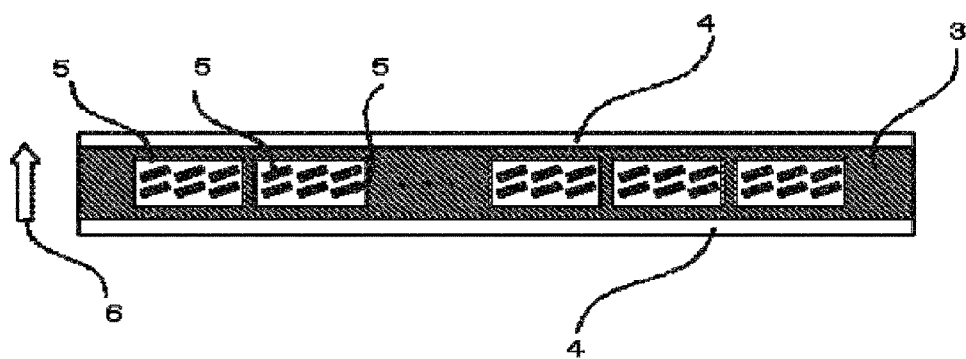
FIG. 14 is a top view of magnetoresistance effect elements in the magnetic sensor device of Embodiment 5 of the present disclosure, as viewed from above.
Figure 14:
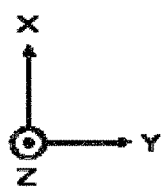

FIGS. 12, 13 and 14 are used for description of the magnetic sensor device of Embodiment 5 of this disclosure. FIG. 12 is a graph indicating the Hy component applied to the magnetoresistance effect elements in FIG. 5. Magnitude of the Hy component is plotted along the vertical axis of the graph illustrated in FIG. 12, and Y-direction position is plotted along the horizontal axis. The dashed-dotted line illustrated in FIG. 12 passes through the origin. Further, the bias magnetic field Hx is applied to the magnetoresistance effect elements 5. Due to the finite length of magnet 3, the Hy component illustrated in FIG. 12 is also applied to the magnetoresistance effect elements 5.

FIG. 13 is a top view of the object to be detected 1 conveyed through the conveyance path 2, in addition to the top view of the configuration of FIG. 5 as viewed from above. That is to say, FIG. 13 can be said to be a top view of the configuration of FIG. 3 as viewed from above. FIG. 13 illustrates the bias magnetic field vectors applied to the component elements 5a and component elements 5b, which are the magnetoresistance effect elements 5. Bias magnetic field vectors 6v indicate the vectors applied to the component elements 5a and the component elements 5b by the yoke 4. As illustrated in FIG. 13, the Hy component has the effect of imparting to the magnetoresistance effect elements 5 bias magnetic field vectors 6a, in the −Y direction from the center of the magnetoresistance effect elements 5, that are tilted toward the −Y direction. In the same manner, the Hy component has the effect of imparting to the magnetoresistance effect elements 5 bias magnetic field vectors 6b, in the +Y direction from the center of the magnetoresistance effect elements 5, that are tilted toward the +Y direction.

As illustrated in FIG. 13, when the hard magnetic material 1a extending parallel to the Y direction is conveyed, a magnetic field change 611a occurs due to the hard magnetic material 1a in a direction (X direction) perpendicular to the hard magnetic material 1a. Due to the magnetic field change 611a, magnetic field changes occur in the X direction for both the bias magnetic field vector 6a tilted in the −Y direction and the bias magnetic field vector 6b tilted in the +Y direction.

Vector rotation occurs due to generation of this X-direction magnetic field change, and the tilt of the bias magnetic field vector 6a changes to become the detection magnetic field vector 61a indicated by the dashed arrow in FIG. 13. This change of tilt of the vector reverses when the hard magnetic material 1a passes by the magnetoresistance effect elements 5. This is due to the magnetic field change 611 reversing in the X direction at the hard magnetic material 1a boundary. Although the bias magnetic field vector 6a and the detection magnetic field vector 61a are both tilted toward the −Y direction, the tilt of the bias magnetic field vector 6a toward the −Y direction is larger. In the same manner as in the relationship between the bias magnetic field vector 6a and the detection magnetic field vector 61a, when vector rotation occurs, the tilt of the bias magnetic field vectors 6b changes to become the detection magnetic field vectors 61b indicated by the dashed-line arrows in FIG. 13. Although the bias magnetic field vector 6b and the detection magnetic field vector 61b are both vectors tilted toward the +Y direction, the tilt of the bias magnetic field vector 6b toward the +Y direction is larger.

In this manner, when the Y direction bias magnetic field is different between the component elements 5a and the component elements 5b of the magnetoresistance effect elements 5, element-by-element variability for each component element 5a and component element 5b is generated in the output of the object to be detected 1. The magnetic sensor device of Embodiment 5 is advantageous when reduction of such variability is required.

FIG. 14 is a top view of the magnetic sensor device of Embodiment 5 as viewed from above. In FIG. 14, constituent elements that are the same or equivalent to those of FIG. 5 are assigned the same reference signs, and descriptions of such constituent elements are omitted. FIG. 14 illustrates a modified example of Embodiment 2 (FIG. 5). In FIG. 14, the X component of the bias magnetic field vector 6v is taken to be applied to the component elements 5a and component elements 5b in the +X direction. On an X-Y plane extending in the X and Y directions, the magnetoresistance effect elements 5 (component elements 5a and component elements 5b) illustrated in FIG. 14 are mounted in two rows, with the same tilt from the longitudinal direction (Y direction) toward the conveyance direction (X direction).

That is to say, for the magnetoresistance effect elements 5 illustrated in FIG. 14, component elements 5a are arranged along the longitudinal direction (Y direction) intersecting the conveyance direction (X direction), which is the direction of passage through the detection region. The component elements 5a are tilted relative to the X and Y directions, and can be said to be formed within the X-Y plane. Moreover, for the magnetoresistive effect elements 5, the component elements 5b are arranged along the Y direction, and the component elements 5b are tilted relative to the X and Y directions and can be said to be formed within the X-Y plane. The tilt angles of the component elements 5a and the component elements 5b illustrated in FIG. 14 are the same. Further, for the component elements 5a and the component elements 5b, the elements neighboring one another in the Y direction have the same tilt.

The configuration illustrated in FIG. 14 enables application, by the X-direction bias magnetic field, of a magnetic flux in a fixed direction, which is the longitudinal +Y direction (non-magnetosensitive direction), of the magnetoresistance effect elements, for both the component elements 5a and the component elements 5b. Thus the Y-direction magnetic field formed by the magnet 3 and the yoke 4 can be canceled, and Hy can be applied in the same direction.

Thus the vector direction of the bias magnetic field is easily arranged for all of the linearly arranged component elements 5a and component elements 5b, and this has the effect of obtaining stable output from the magnetic sensor device.

Embodiment 6

Figure 15:
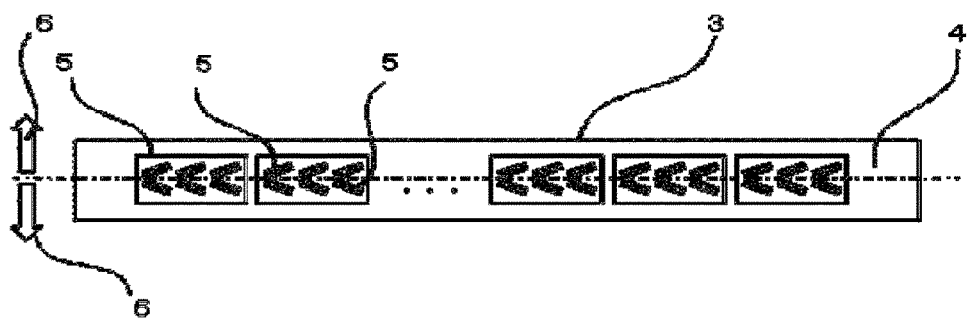
FIG. 15 is a top view of magnetoresistance effect elements in the magnetic sensor device of Embodiment 6 of the present disclosure, as viewed from above.
Figure 15:
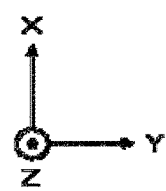

FIG. 15 is used to describe the magnetic sensor device of Embodiment 6 of this disclosure. In FIG. 15, constituent elements that are the same or equivalent to those of FIG. 9 are assigned the same reference signs, and descriptions of such constituent elements are omitted. FIG. 15 illustrates a modified example of Embodiment 3 (FIG. 9).

In the magnetoresistance effect elements 5 of the magnetic sensor device illustrated in FIG. 9, the applied Hy component is the same as in FIG. 12. Thus in the same manner as in FIG. 13 as explained in Embodiment 5, rotation of the bias magnetic field vector 6v occurs, and when the Y direction bias magnetic field is different between the component elements 5a and between the component elements 5b of the magnetoresistance effect elements 5, element-by-element variability for each component element 5a and component element 5b is generated in the output of the object to be detected 1. The magnetic sensor device of Embodiment 6, in the same manner as the magnetic sensor device of Embodiment 5, is advantageous when reduction of such variability is required.

FIG. 15 is a top view of the magnetic sensor device of Embodiment 6 as viewed from above. In FIG. 15, the bias magnetic field vector 6v X-component is taken to be applied in the +X direction for the component elements 5a and in the −X direction for the component elements 5b. On an X-Y plane extending in the X and Y directions, the magnetoresistance effect elements 5 (component elements 5a and component elements 5b) illustrated in FIG. 15 are mounted in two rows, with the tilt from the longitudinal direction (Y direction) toward the conveyance direction (X direction). The component elements 5a and the component elements 5b are configured symmetrically relative to the Y axis (dashed-dotted axis illustrated in FIG. 15) passing through the origin.

For the magnetoresistive effect elements 5 illustrated in FIG. 15, the component elements 5a are arranged along the longitudinal direction (Y direction), which intersects the conveyance direction (X direction), which is the direction of passage through the detection region. The component elements 5a are tilted relative to the X and Y directions and can be said to be formed within the X-Y plane. Furthermore, for the magnetoresistive effect elements 5 illustrated in FIG. 15, the component elements 5b are arranged along the Y direction, and the component elements 5b are tilted relative to the X and Y directions and can be said to be formed within the X-Y plane.

For the component elements 5a and the component elements 5b illustrated in FIG. 15, among the component elements 5a arranged in one row and the component elements 5b arranged in another row, component elements that are adjacent to one another in the X direction have mutually different directions of tilt. Although the directions of tilt are mutually different, the configuration of elements is symmetric relative to the Y axis (dashed-dotted axis illustrated in FIG. 15). Further, for the component elements 5a and the component elements 5b, the elements neighboring one another in the Y direction have the same tilt. The Y axis, which is the axis of symmetry of the component elements 5a and the component elements 5b, can be said to pass through the conveyance direction (X direction) central portion of the magnet 3 (yoke 4).

In the configuration illustrated in FIG. 15, the +X-direction bias magnetic field at the component elements 5a and the −X-direction bias magnetic field at the component elements 5b enable application of a magnetic field in a fixed direction, which is the longitudinal +Y direction (non-magnetosensitive direction) of the magnetoresistance effect element, for both the component elements 5a and the component elements 5b. Thus the Y-direction magnetic field formed by the magnet 3 and the yoke 4 can be canceled, and Hy can be applied in the same direction. This enables the magnetic sensor of Embodiment 6 to obtain the same effects as those of the magnetic sensor of Embodiment 5.

Embodiment 7

Figure 16:
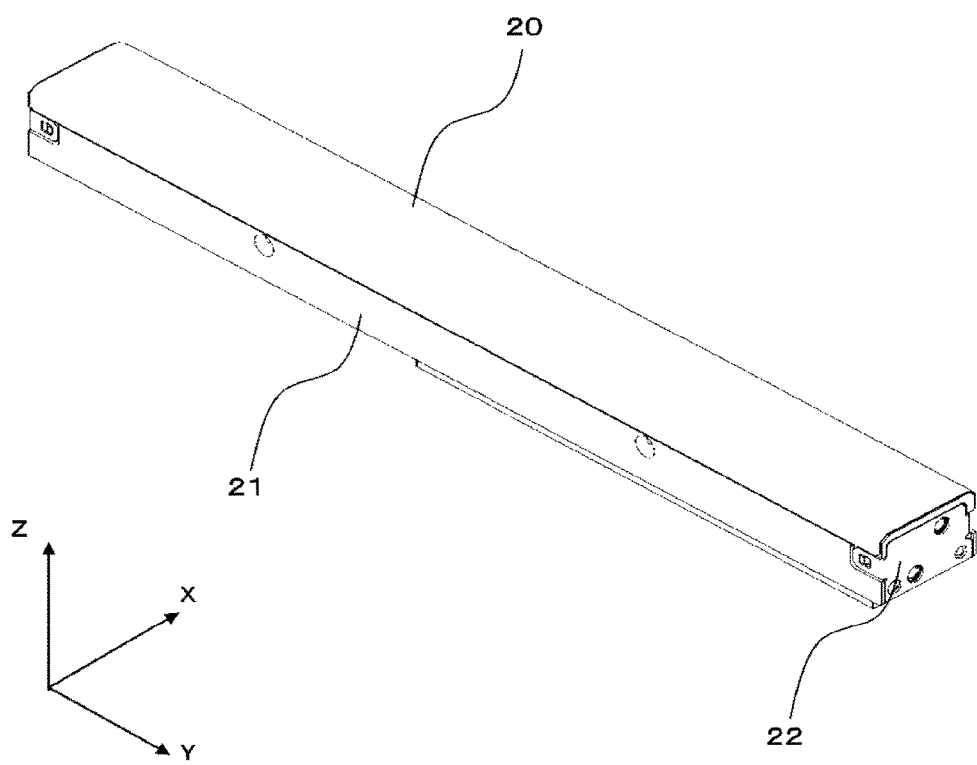
FIG. 16 is a perspective view of a magnetic sensor device of Embodiment 7 of the present disclosure.
Figure 17:
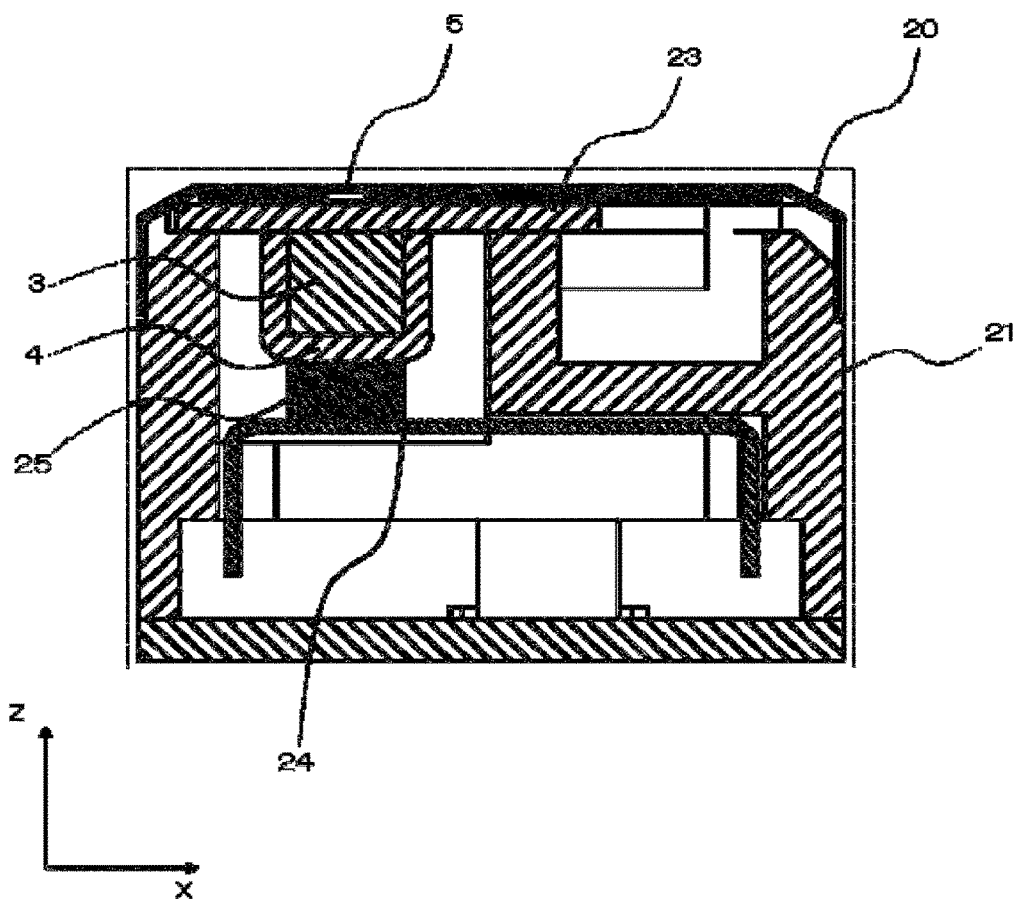
FIG. 17 is a conveyance-direction cross-sectional drawing of the magnetic sensor device of Embodiment 7 of the present disclosure.

FIGS. 16 and 17 are used for description of a magnetic sensor device of Embodiment 7 of this disclosure. FIG. 16 is a tilted perspective view of the magnetic sensor device of Embodiment 7. FIG. 17 is a conveyance-direction cross-sectional drawing of the magnetic sensor device of Embodiment 7. In FIGS. 16 and 17, constituent elements that are the same or equivalent to those of FIGS. 5, 6 and 7 are assigned the same reference signs, and descriptions of such constituent elements are omitted.

In FIGS. 16 and 17, the magnetoresistance effect elements 5 of the magnetic sensor device are covered by a non-magnetic material metal. The non-magnetic material metal protects the magnetic sensor device from contact with the object to be detected 1, contamination by foreign objects, and the like. Further, the non-magnetic material metal allows passage of the magnetic field and electrically shields the magnetic sensor device. Specifically, the magnetic sensor device has as an outer covering a shield cover 20, a case 21 formed from resin or metal, and a metallic bracket 22. The shield cover 20 extends in the longitudinal direction (Y direction). The case 21 fixes the shield cover 20, and contains and protects the magnet 3, yoke 4 and magnetoresistance effect elements 5. The bracket 22 is electrically connected to the shield cover 20, grounds the magnetic sensor device, and is arranged at a longitudinal direction (Y direction) end portion of the case 21.

The magnet 3 (yoke-attached magnet 34) and the magnetoresistance effect elements 5 are arranged with a prescribed distance therebetween in order to apply a suitable bias magnetic field to the magnetoresistance effect elements 5 of the magnetic sensor device. The prescribed distance enables disposal of a non-magnetic carrier 23 between the magnet 3 (yoke-attached magnet 34) and the magnetoresistance effect elements 5. The magnetoresistance effect elements 5 are fixed to the non-magnetic carrier 23. A non-illustrated IC is used for amplification and signal processing of the resistance value change signal from the magnetoresistance effect elements 5 fixed upon the non-magnetic carrier 23. The non-magnetic carrier 23 is fixed to the conveyance path 2 side of the magnet 3. In the magnetic sensor device of the present disclosure, the non-magnetic carrier 23 is mounted on the yoke-attached magnet 34, and the magnetoresistance effect elements 5 can be said to be formed on this non-magnetic carrier 23. The IC is also formed on the non-magnetic carrier 23.

The magnetic sensor device illustrated in FIG. 17 is illustrated in conveyance-direction cross section, which is an X-Z plane cross section extending in the X and Z directions. As seen in this cross section, the yoke 4 covers the magnet 3 except at locations of the magnet 3 opposite to the conveyance path. Further, the portion of the yoke 4 opposite to the conveyance path 2 side of the magnet 3 is configured for heat dissipation, and has a metallic heat dissipation component 24 configured for heat dissipation from a heat dissipation component 24 through the heat conduction spacer 25. Therefore, due to contact between the non-magnetic carrier 23 and the magnet 3 and the yoke 4, dissipation of heat from the heat dissipation component 24 through the magnet 3 and the yoke 4 is enabled even when the non-magnetic carrier 23 generates heat. That is to say, even when the magnetoresistance effect elements 5 and the IC fixed upon the non-magnetic carrier 23 generate heat, easy dissipation of heat is enabled by thermal contact between the heat dissipation component 24 and the magnetoresistance effect elements 5 and the IC. To increase heat dissipation surface area, the heat dissipation component 24 has an angular U-shaped bent structure in a cross section in the X-Z plane extending in the conveyance direction (X direction) and Z direction. The heat dissipation component 24 of this shape, together with the heat conductor spacer 25, extends in the longitudinal direction (Y direction). Further, the heat dissipation component 24 and the heat conduction spacer 25 may be collectively termed the heat dissipation component (heat dissipation member). Of course, the heat dissipation component 24 and the heat conduction spacer 25 may be an integrated part (member).

The basic configuration and operation of the magnetic sensor device are the same as those of the magnetic sensor device of Embodiment 2. In particular, the configuration of the yoke-attached magnet 34 is the same for Embodiment 7 and Embodiment 2. In Embodiment 7, the magnetoresistance effect elements 5 and the IC, which are heat-generating components, are fixed to the metallic carrier 23. Thus as described above, there is a thermal connection to the heat dissipation component 24 through the yoke-attached magnet 34 (magnet 3 and yoke 4) and the heat conduction spacer 25. Thus heat generated by the magnetoresistance effect elements 5 and the IC can be efficiently released to the air surrounding the metallic carrier 23, yoke-attached magnet 34 (magnet 3 and yoke 4), heat conduction spacer 25, heat dissipation component 24 and the like. Therefore temperature rise of the magnetoresistance effect elements 5 and the IC is prevented, and thus a magnetic sensor device is obtained that is easily handled and has improved reliability.

Through the bracket 22, the shield cover 20 is grounded to an upper-level system side device, and thus damage and erroneous operation of the magnetoresistance effect elements 5 and the IC due to static electricity are prevented, and a magnetic sensor device is obtain that has improved performance and reliability. The expression upper-level system indicates a paper currency discrimination device and the like in which the magnetic sensor device is installed. Moreover, mechanical connection between the bracket 22 and the heat dissipation component 24 causes the heat generated by the magnetic sensor device to be transmitted to the system-side device and further suppresses temperature rise of the magnetic sensor device.

Embodiment 8

Figure 18:
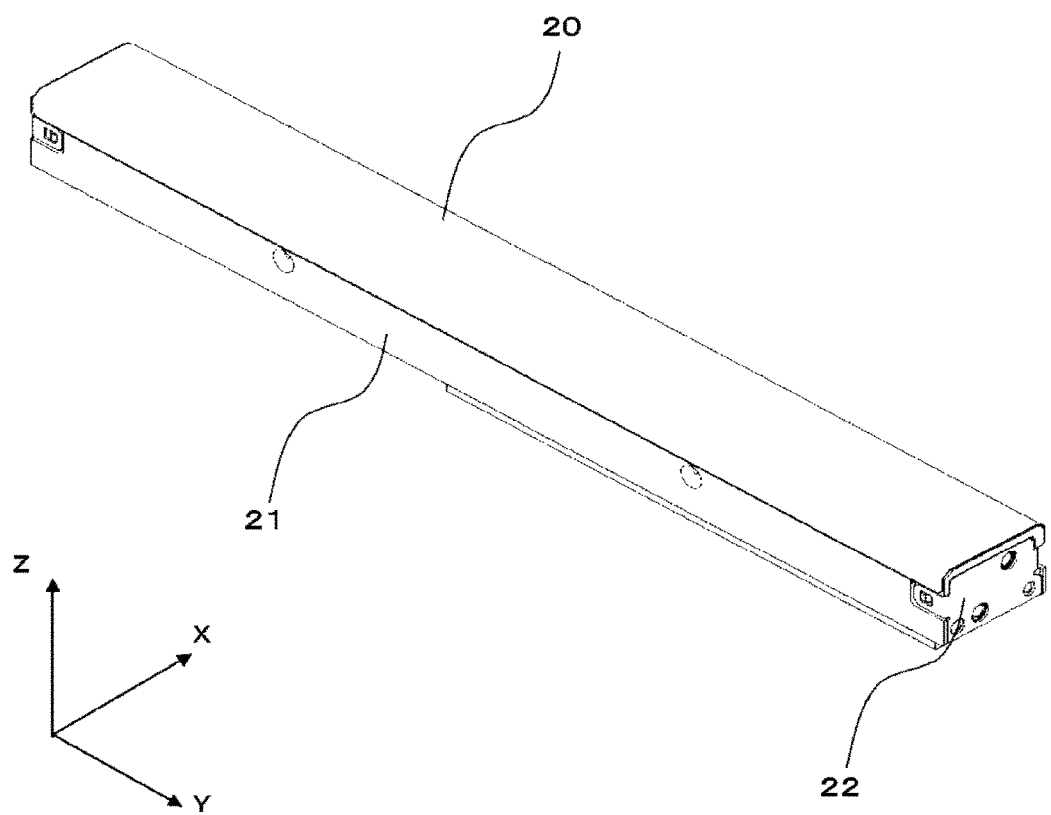
FIG. 18 is a perspective view of a magnetic sensor device of Embodiment 8 of the present disclosure.
Figure 19:
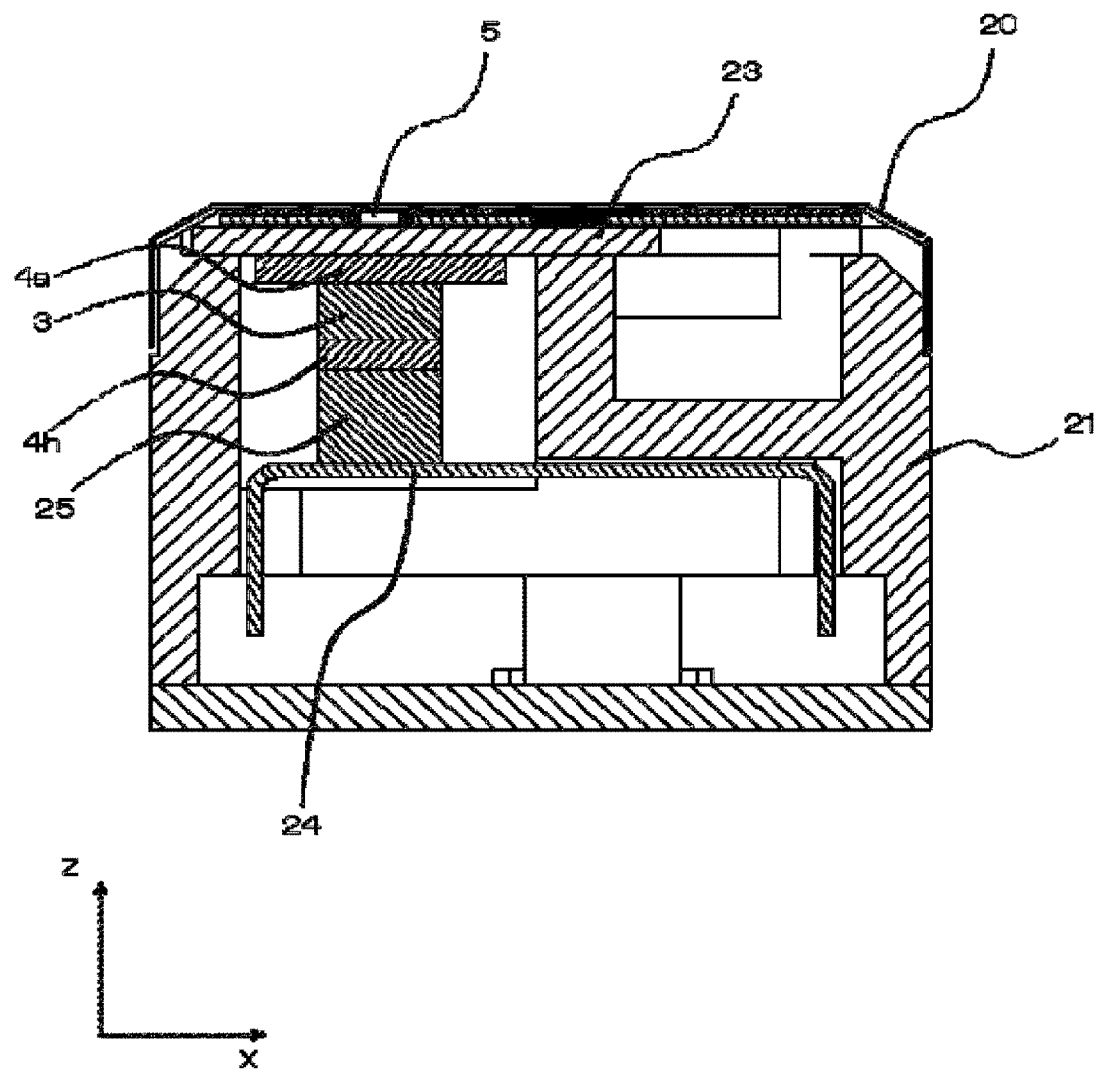
FIG. 19 is a conveyance-direction cross-sectional drawing of the magnetic sensor device of Embodiment 8 of the present disclosure.

FIGS. 18 and 19 are used to described a magnetic sensor device of Embodiment 8 of this disclosure. FIG. 18 is a tilted perspective view of the magnetic sensor device of Embodiment 8. FIG. 19 is a conveyance-direction cross-sectional drawing of the magnetic sensor device of Embodiment 8. In FIGS. 18 and 19, constituent elements that are the same or equivalent to those of FIGS. 8, 9, 10, 16 and 17 are assigned the same reference signs, and descriptions of such constituent elements are omitted. The basic configuration and operation of the magnetic sensor device are the same as those of the magnetic sensor device of Embodiment 3. In particular, the configuration of the yoke-attached magnet 34 is the same for Embodiment 8 and Embodiment 3.

The magnetic sensor device of Embodiment 8 and the magnetic sensor device of Embodiment 7 differ only in the configurations of the yoke-attached magnet 34. Thus FIG. 18, which illustrates the outer covering of the magnetic sensor device, illustrates an outer covering that is the same as that of FIG. 16. The yoke 4 is formed on the magnet 3 of the magnetic sensor device of Embodiment 7. On the other hand, the yoke 4a and yoke 4h are formed on the magnet 3 of the magnetic sensor device of Embodiment 8.

In FIG. 19, a pair of yokes, the yoke 4a and yoke 4h, are arranged at the direction perpendicular to the conveyance direction (Z direction) magnet pole ends of the magnet 3. That is to say, the positional relationship between the "yoke" and the metallic carrier 23 is different from that of FIG. 17. Further, although the metallic carrier 23 contacts the magnet 3 in FIG. 17, the metallic carrier 23 and the magnet 3 do not contact in FIG. 18. However, due to contact between the metallic carrier 23 and the yoke 4a in the magnetic sensor device of Embodiment 8, heat is transmitted from the yoke 4a to the magnet 3 and from the magnet 3 to the yoke 4h. Therefore due to contact between the yoke 4h and the heat conduction spacer 25, the operation and effect of Embodiment 8 are the same as those of Embodiment 7.

Embodiment 9

Figure 20:
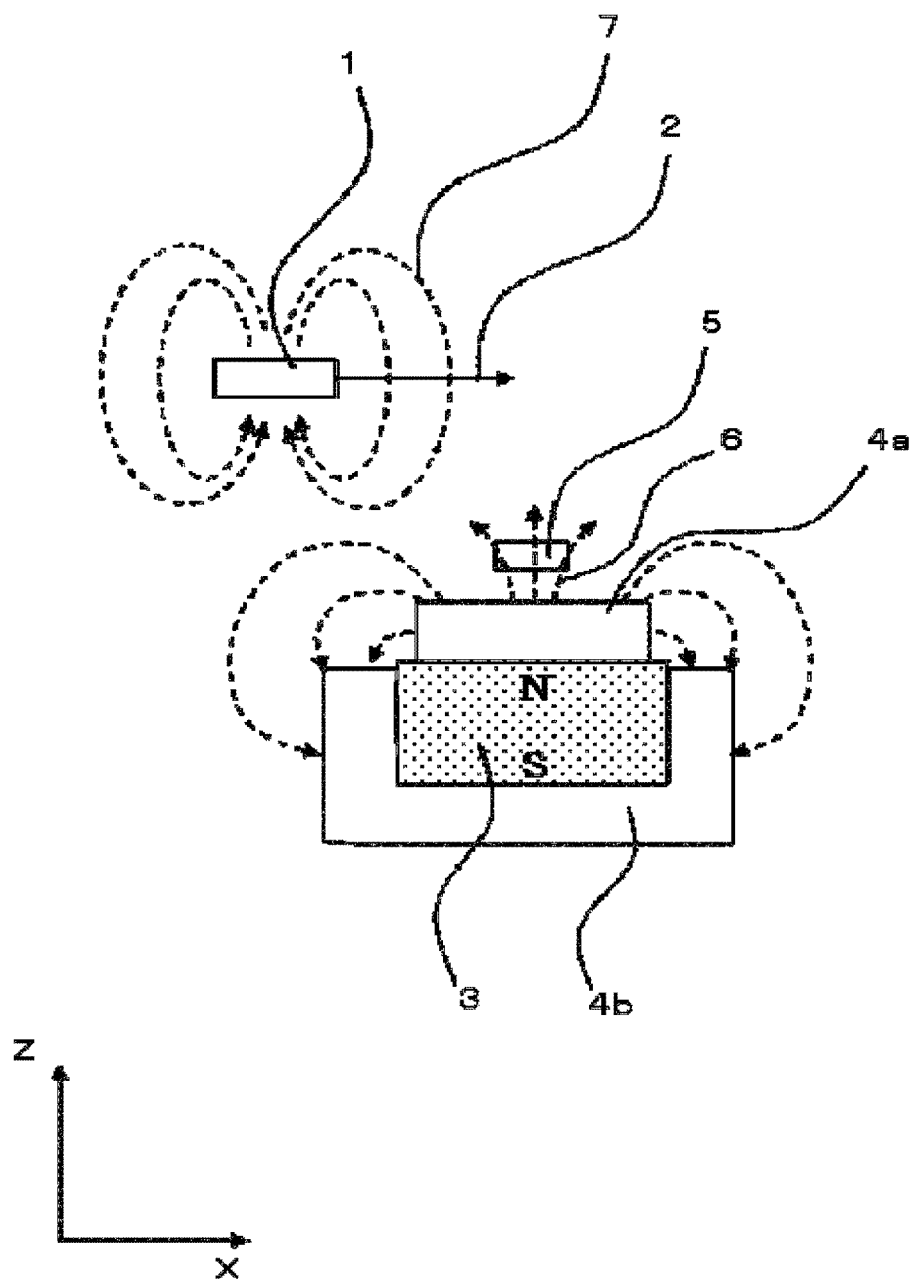
FIG. 20 is a configuration diagram of a magnetic sensor device of Embodiment 9 of the present disclosure.
Figure 21:
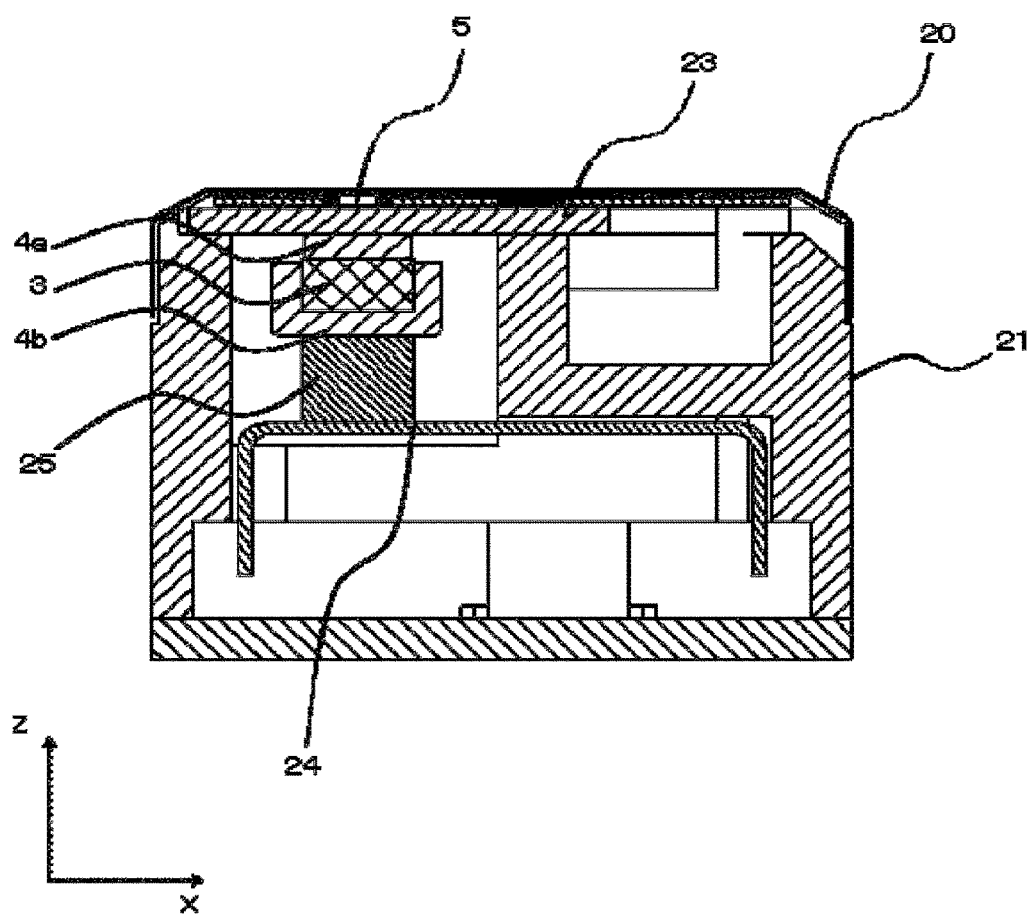
FIG. 21 is a conveyance-direction cross-sectional drawing of the magnetic sensor device of Embodiment 9 of the present disclosure.

Figures are used for description of a magnetic sensor device of Embodiment 9 of this disclosure. FIG. 20 is a configuration diagram of the magnetic sensor device of Embodiment 9. FIG. 21 is a conveyance-direction cross-sectional drawing of the magnetic sensor device of Embodiment 9. In FIGS. 20 and 21, constituent elements that are the same or equivalent to those of FIGS. 8, 9, 10, 18 and 19 are assigned the same reference signs, and descriptions of such constituent elements are omitted. In FIGS. 20 and 21, the magnet 3 has magnetic poles that are mutually different, N pole and S pole, in the direction perpendicular (Z direction) to the conveyance direction 2. That is to say, the magnet 3 has magnetic poles that are arranged along the direction (Z direction) orthogonal to the conveyance direction 2, which is the direction of passage of the object to be detected 1.

The yoke 4a is arranged at the side surface of the magnet 3 extending along the conveyance direction 2 of the N-pole side end. That is to say, the yoke 4a is formed on the side of the magnet 3 opposing the magnetoresistance effect elements 5. The yoke 4b is the second yoke. Thus the yoke 4a may be termed the first yoke. In the present disclosure, X-direction length of the yoke 4a illustrated in FIGS. 20 to 31 is shorter than the X-direction length of the magnet 3. The yoke 4b is arranged so as to cover the magnet 3 except a portion facing the yoke 4a. In particular, the yoke 4b is formed, in the X direction, on both the front end and rear end of the magnet 3. Moreover, the yoke 4b is continuous from the side of the magnet 3 opposing the magnetoresistance effect elements 5 to the side of the magnet that is opposite thereto. That is to say, the yoke 4b is constituted by portions formed at the front end and rear end of the magnet 3, and by a portion formed at the side of the magnet 3 opposite to the side opposing the magnetoresistance effect elements 5.

In FIG. 20, the magnetoresistance effect elements 5 are arranged, at the magnet 3 N-pole side yoke 4a and the X-direction width central portion of the magnet 3, between the yoke 4a and the conveyance path 2 of the object to be detected 1. That is to say, the magnetoresistance effect elements 5 are arranged on a virtual line extending in the Z direction, which is the direction of arrangement of the magnet 3 and yoke 4*a*. This virtual line is omitted from the figure. Further, the central portion of the magnet 3, the central portion of the yoke 4*a*, and the central portion of the magnetoresistance effect elements 5 coincide with one another in the X direction. Thus the central portion of the magnet 3, the central portion of the yoke 4*a*, and the central portion of the magnetoresistance effect elements 5 intersect the Z axis passing through the origin.

The bias magnetic field 6 is described below. The yoke 4*a* is arranged on the surface extending along the conveyance direction 2 of the side of the magnet 3 N-pole side end, and the yoke 4*b* is arranged so as to cover the magnet 3 except a portion facing the yoke 4*a*. Thus the magnetic field from the magnetic pole that passes through the yoke 4*a* and is directed further in the Z direction becomes small, and the magnetic field directed in the X direction becomes large.

When the magnetic sensor device is configured in this manner, in comparison to Embodiment 3, the magnetic field applied to the object to be detected 1 (hard magnetic material 1*a*) such as paper currency and the like can become further decreased by the magnet 3, yoke 4*a* and yoke 4*b* in the vicinity of the magnetoresistance effect elements 5. Even when the object to be detected 1 includes a soft magnetic material that does not self-generate a magnetic field, the detection level of the soft magnetic material is further decreased, thereby enabling further distinction between the hard magnetic material and the soft magnetic material. FIG. 22 through FIG. 25 are used for description of a yoke 4*c* and a yoke 4*d*, which are separate examples of the yoke 4*b* of the magnetic sensor device of Embodiment 9.

Figure 22:
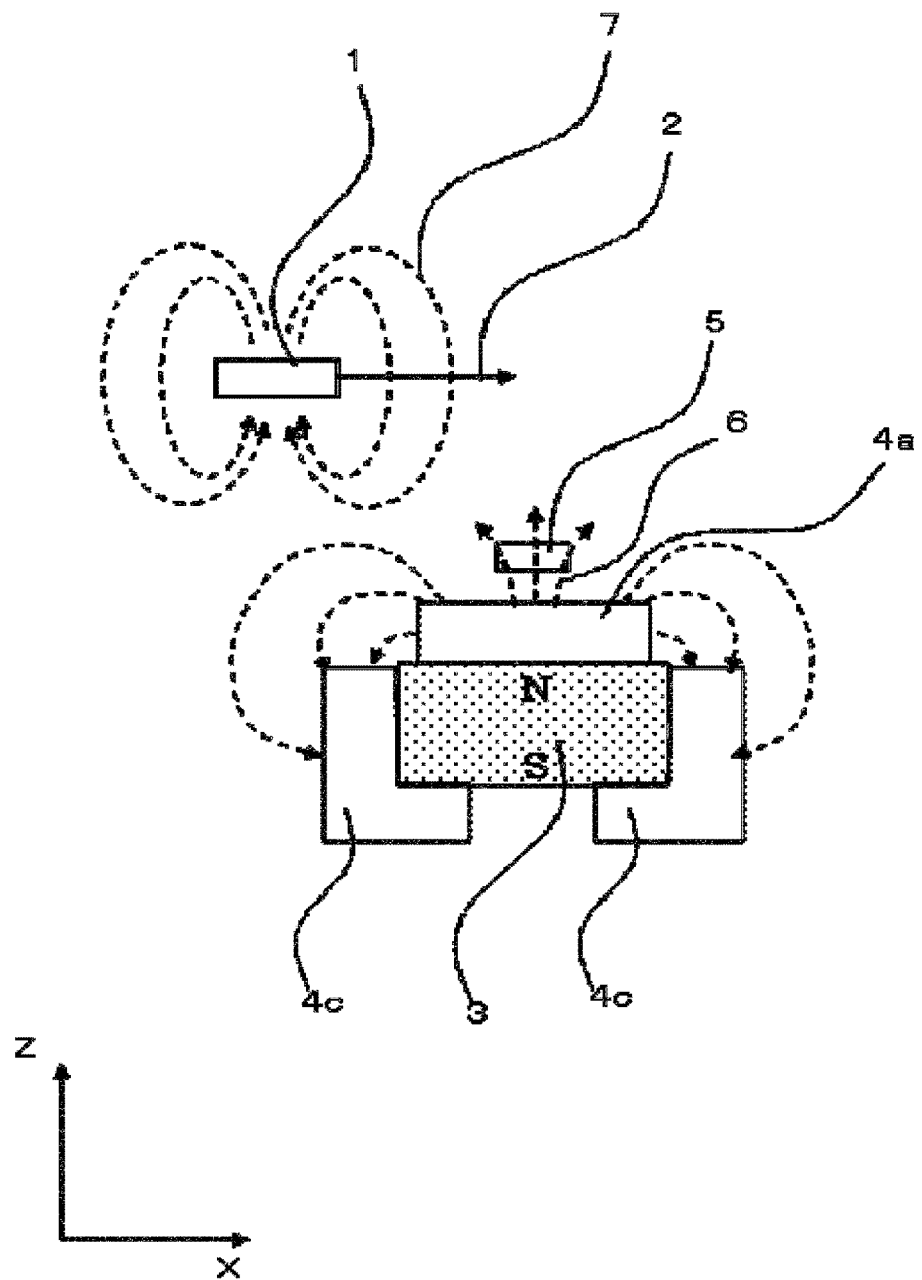
FIG. 22 is a configuration diagram of the magnetic sensor device of Embodiment 9 of the present disclosure.
Figure 23:
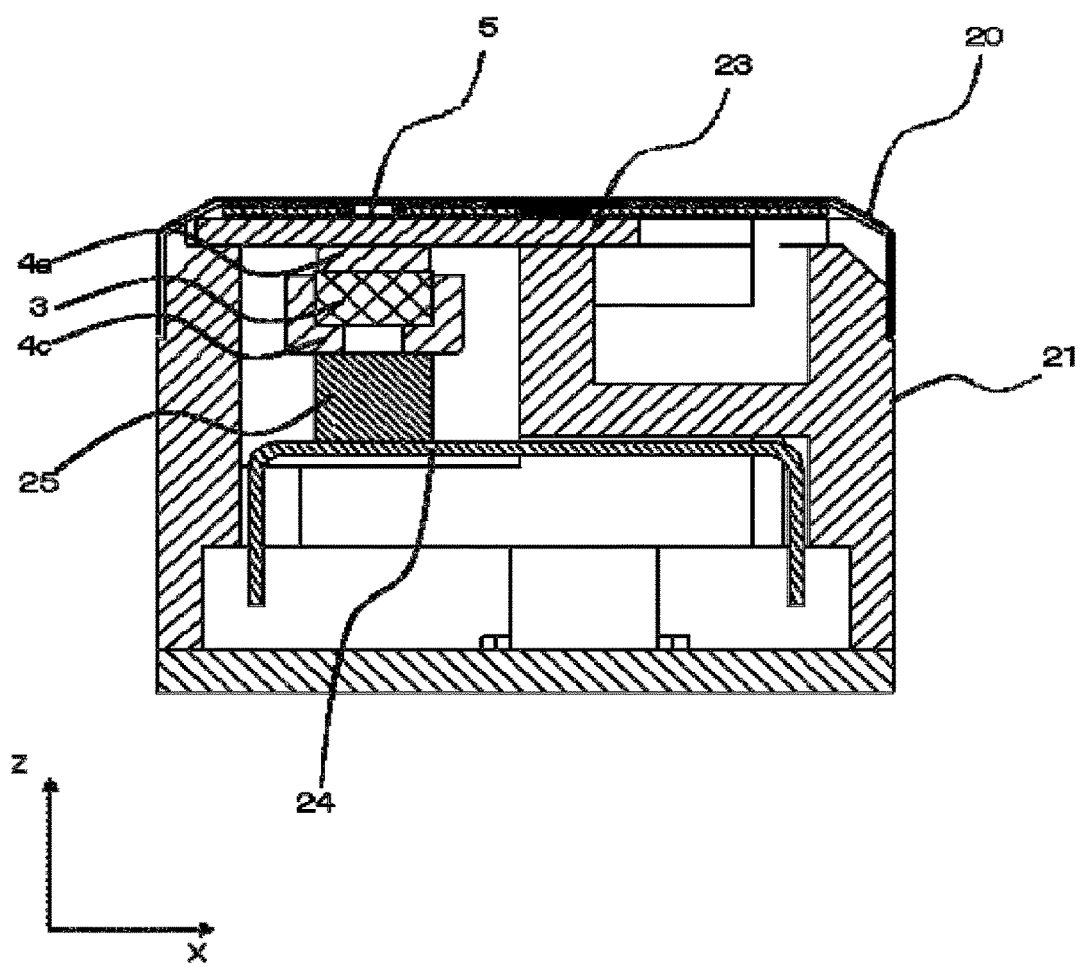
FIG. 23 is a conveyance-direction cross-sectional drawing of the magnetic sensor device of Embodiment 9 of the present disclosure.

As illustrated in FIGS. 22 and 23, the yoke 4*b* illustrated in FIGS. 20 and 21 is divided into two parts, and although the resultant configuration arranges two yokes 4*c*, the obtained effect is the same. That is to say, the configuration of the yoke 4*c* illustrated in FIGS. 22 and 23 is obtained by cutting away part of a portion of the yoke 4*b* formed on the side of the magnet 3 opposite to the side opposing the magnetoresistance effect elements 5, and exposing the magnet 3 through the cut-away part.

Figure 24:
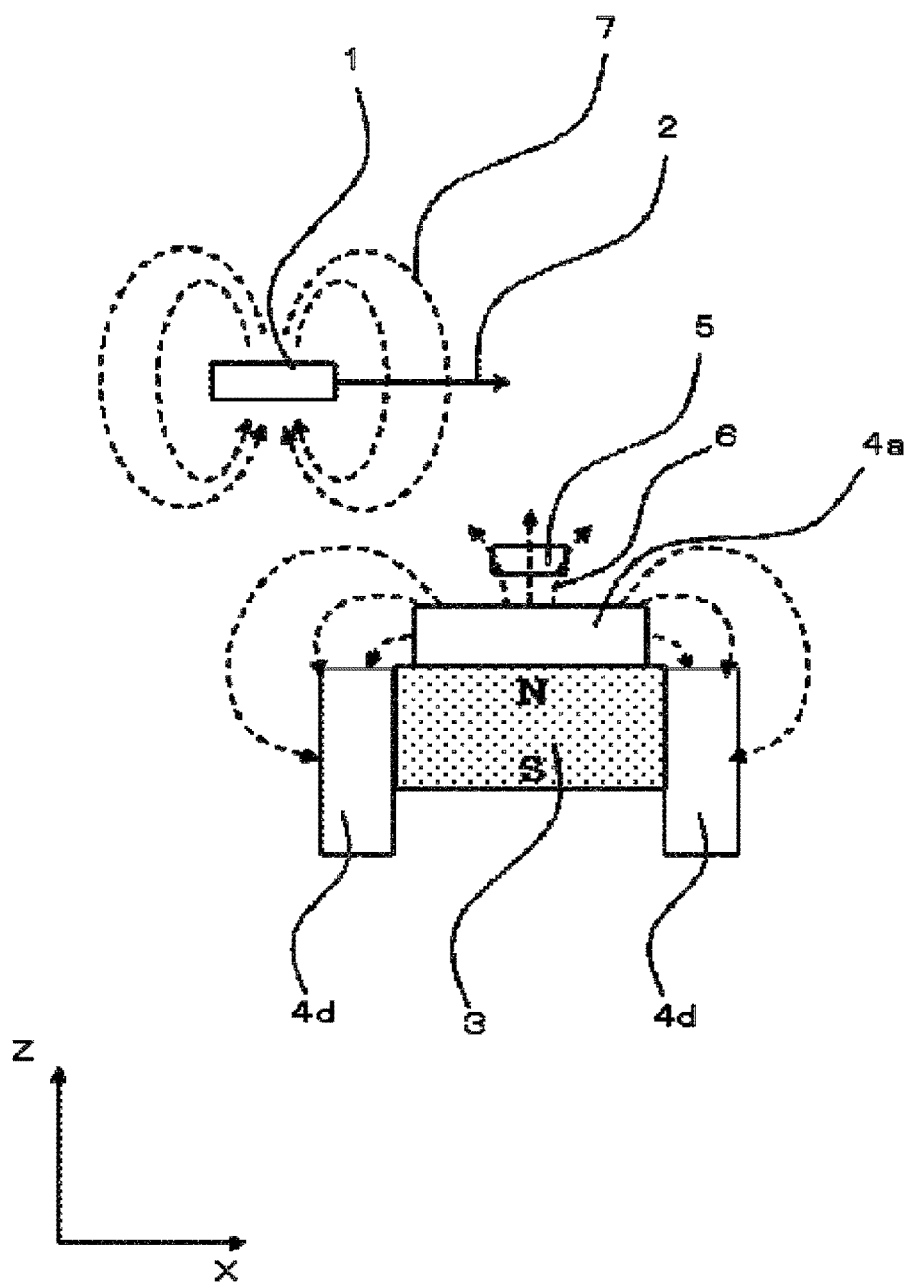
FIG. 24 is a configuration diagram of the magnetic sensor device of Embodiment 9 of the present disclosure.
Figure 25:
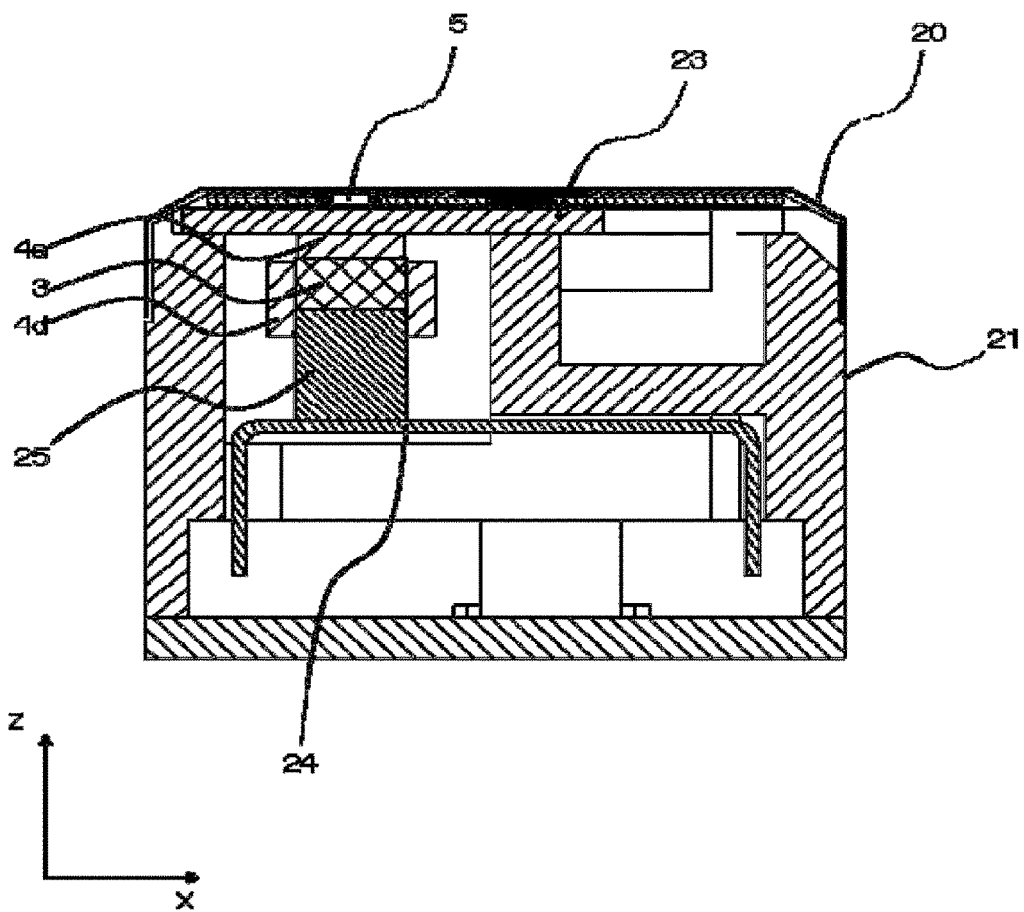
FIG. 25 is a conveyance-direction cross-sectional drawing of the magnetic sensor device of Embodiment 9 of the present disclosure.

Furthermore, the same effect would be obtained even in the case in which no "yoke" is arranged at the side surface of the magnet 3 S-pole side end opposite to the conveyance surface as illustrated in FIGS. 24 and 25, and the yoke 4*d* is arranged at the magnetization direction lateral face of the magnet 3. That is to say, the configuration of the yoke 4*d* illustrated in FIGS. 24 and 25 removes the portion formed at the side opposite to the side opposing the magnetoresistance effect elements 5 in the yoke 4*b* of the magnet 3 illustrated in FIGS. 20 and 21. In other words, the yoke 4*d* illustrated in FIGS. 24 and 25 can be said to be only the portions of the yoke 4*b* that are formed at the front end and rear end of the magnet 3.

The yoke 4*b* in FIG. 21, the yoke 4*c* in FIG. 23, and the yoke 4*d* in FIG. 25 are different in shape in comparison to the yoke 4 of FIG. 17, which is described in Embodiment 7. However, in the magnetic sensor device of Embodiment 9, due to contact between the metallic carrier 23 and the yoke 4*a*, heat from the yoke 4*a* is conducted to the magnet 3, and is conducted from the magnet 3 to the yoke 4*h*. Thus by making the yoke 4*b*, yoke 4*c* and yoke 4*d* contact the heat conduction spacer 25, the operation and effect of Embodiment 9 are the same as for Embodiment 7 with respect to heat dissipation. Further, as illustrated in FIG. 25, the magnetic sensor device of Embodiment 9, rather than just causing contact between the yoke 4*d* and the heat conduction spacer 25, may also cause contact between the magnet 3 and the heat conduction spacer 25. Of course, in the magnetic sensor device of Embodiment 9, contact only between the magnet 3 and the heat conduction spacer 25, without contact between the yoke 4*d* and the heat conduction spacer 25, is permissible.

Embodiment 10

Figure 26:
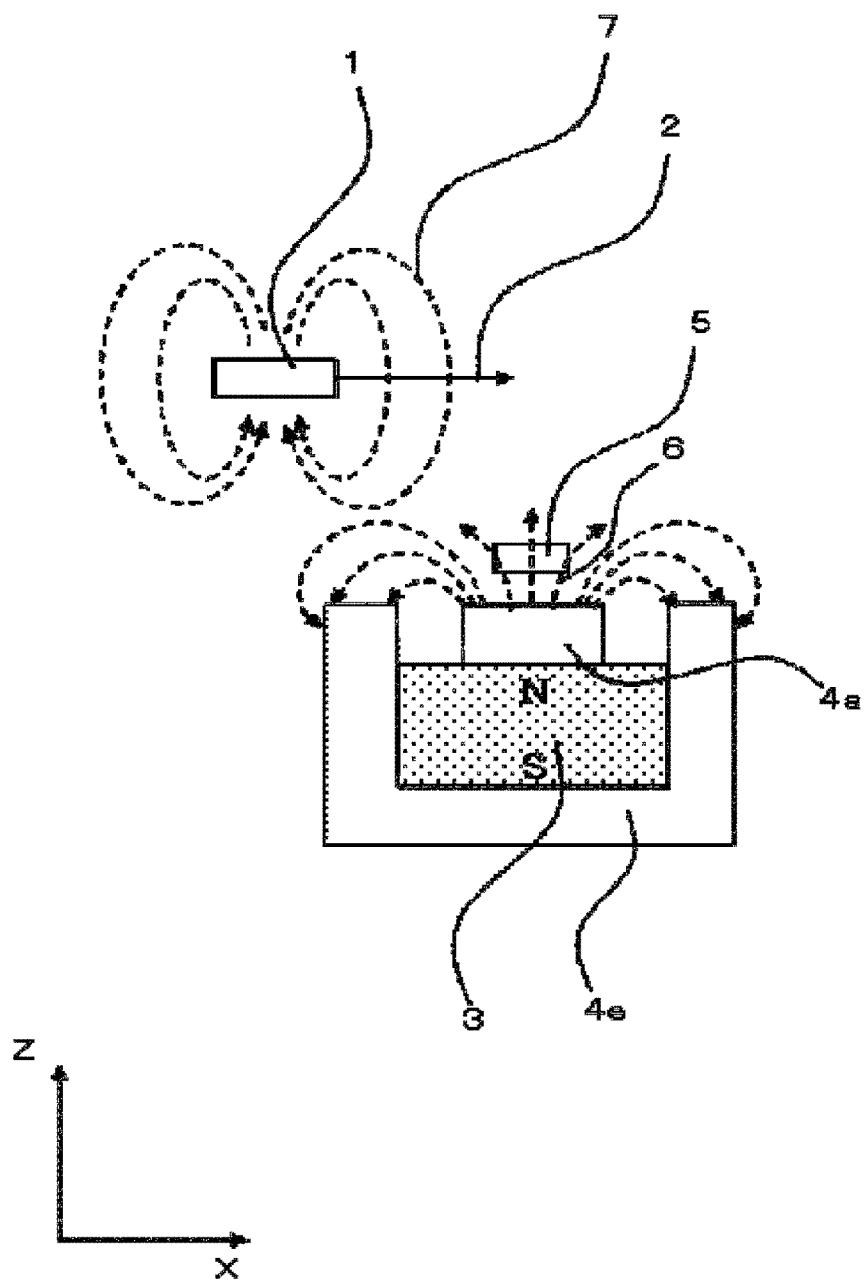
FIG. 26 is a configuration diagram of a magnetic sensor device of Embodiment 10 of the present disclosure.
Figure 27:
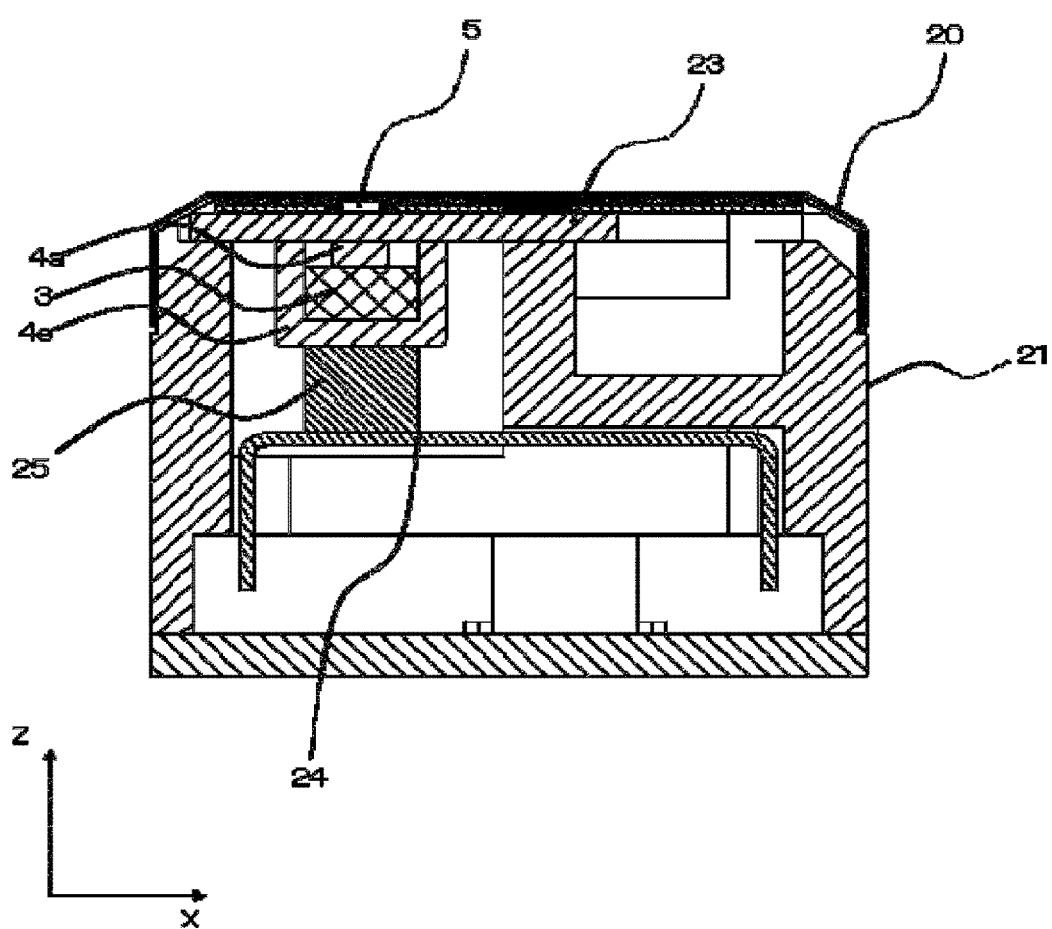
FIG. 27 is a conveyance-direction cross-sectional drawing of the magnetic sensor device of Embodiment 10 of the present disclosure.

Figures are used for description of a magnetic sensor device of Embodiment 10 of this disclosure. FIG. 26 is a configuration diagram of the magnetic sensor device of Embodiment 10. FIG. 27 is a conveyance-direction cross-sectional drawing of the magnetic sensor device of Embodiment 10. In FIGS. 26 and 27, constituent elements that are the same or equivalent to those of FIGS. 6 through 10 and FIGS. 18 and 19 are assigned the same reference signs, and descriptions of such constituent elements are omitted. In FIGS. 26 and 27, the magnet 3 has magnetic poles that are mutually different, N pole and S pole, in the direction perpendicular (Z direction) to the conveyance direction 2. That is to say, the magnet 3 has magnetic poles that are arranged along the direction (Z direction) orthogonal to the conveyance direction 2, which is the direction of passage of the object to be detected 1.

The yoke 4*a* is arranged at the side surface of the magnet 3 N-pole side end extending along the conveyance direction 2. That is to say, the yoke 4*a* is formed at the side of the magnet 3 opposing the magnetoresistance effect elements 5. The yoke 4*b* is the second yoke. Thus the yoke 4*a* may be termed the first yoke. The yoke 4*e* is arranged so as to cover the magnet 3 except a portion facing the yoke 4*a*, and protrudes to the conveyance path 2 side.

In particular, the yoke 4*e* is formed at both X-direction ends, the front end and rear end, of the magnet 3. Moreover, the yoke 4*e* is continuous from the side of the magnet 3 opposing the magnetoresistance effect elements 5 to the side of the magnet that is opposite to the magnetoresistance effect elements 5. That is to say, the yoke 4*e* is constituted by portions formed at the front end and rear end of the magnet 3, and by a portion formed at the side of the magnet 3 opposite to the side opposing the magnetoresistance effect elements 5. Further, in the Z direction, the portions formed at the front end and rear end of the magnet 3 have protruding portions that protrude to the conveyance path 2 side from the magnet 3.

As illustrated in FIGS. 26 and 27, Z-direction height at the conveyance path 2 side of the protruding portions of the yoke 4*e* is preferably nearly the same as the Z-direction height at the conveyance path 2 side of the yoke 4*a*, from the standpoint of heat dissipation. This preference is due to the allowing of both the yoke 4*a* and the yoke 4*e* to contact the metallic carrier 23. Also for a below described yoke 4*f* and yoke 4*g*, Z-direction height at the conveyance path 2 side of the protruding portions of the yoke 4*f* and the yoke 4*g* is preferably nearly the same as the Z-direction height at the conveyance path 2 side of the yoke 4*a*, from the standpoint of heat dissipation. This preference is due to the allowing of the yoke 4*g* and the yoke 4*f*, in addition to the yoke 4*a*, to contact the metallic carrier 23.

In FIG. 26, the magnetoresistance effect elements 5 are arranged, at the magnet 3 N-pole side yoke 4*a* and the X-direction width central portion of the magnet 3, between the yoke 4*a* and the conveyance path 2 of the object to be detected 1. That is to say, the magnetoresistance effect elements 5 are arranged on a virtual line extending in the Z direction, which is the direction of arrangement of the magnet 3 and yoke 4a. This virtual line is omitted from the figure. Further, the central portion of the magnet 3, the central portion of the yoke 4a, and the central portion of the magnetoresistance effect elements 5 coincide with one another in the X direction. Thus the central portion of the magnet 3, the central portion of the yoke 4a, and the central portion of the magnetoresistance effect elements 5 intersect the Z axis passing through the origin.

The bias magnetic field 6 is described below. The yoke 4a is arranged on the surface extending along the conveyance direction 2 of the side of the magnet 3 N-pole side end, and the yoke 4e is arranged so as to cover the magnet 3 except a portion facing the yoke 4a and to protrude to the conveyance path 2 side. Thus the magnetic field from the magnetic pole that passes through the yoke 4a and is directed further in the Z direction becomes smaller, and the magnetic field directed in the X direction becomes larger.

When the magnetic sensor device is configured in this manner, the magnetic field applied to the object to be detected 1 (hard magnetic material 1a) such as paper currency and the like can become further decreased by the magnet 3, yoke 4a and yoke 4b in the vicinity of the magnetoresistance effect elements 5 in comparison to Embodiment 9. Even when the object to be detected 1 includes a soft magnetic material that does not self-generate a magnetic field, the detection level of the soft magnetic material is further decreased, thereby enabling further distinction between the hard magnetic material and the soft magnetic material.

Figure 28:
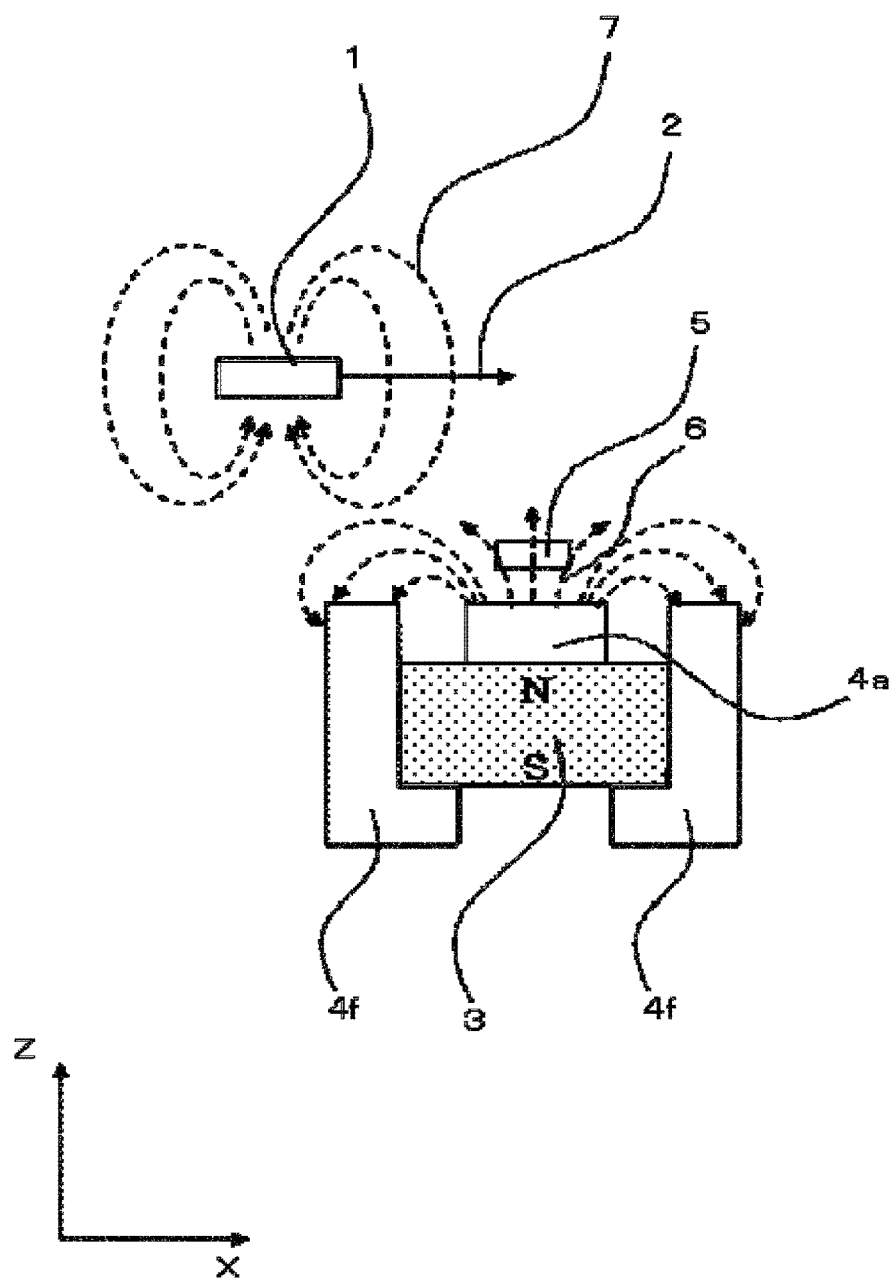
FIG. 28 is a configuration diagram of the magnetic sensor device of Embodiment 10 of the present disclosure.
Figure 29:
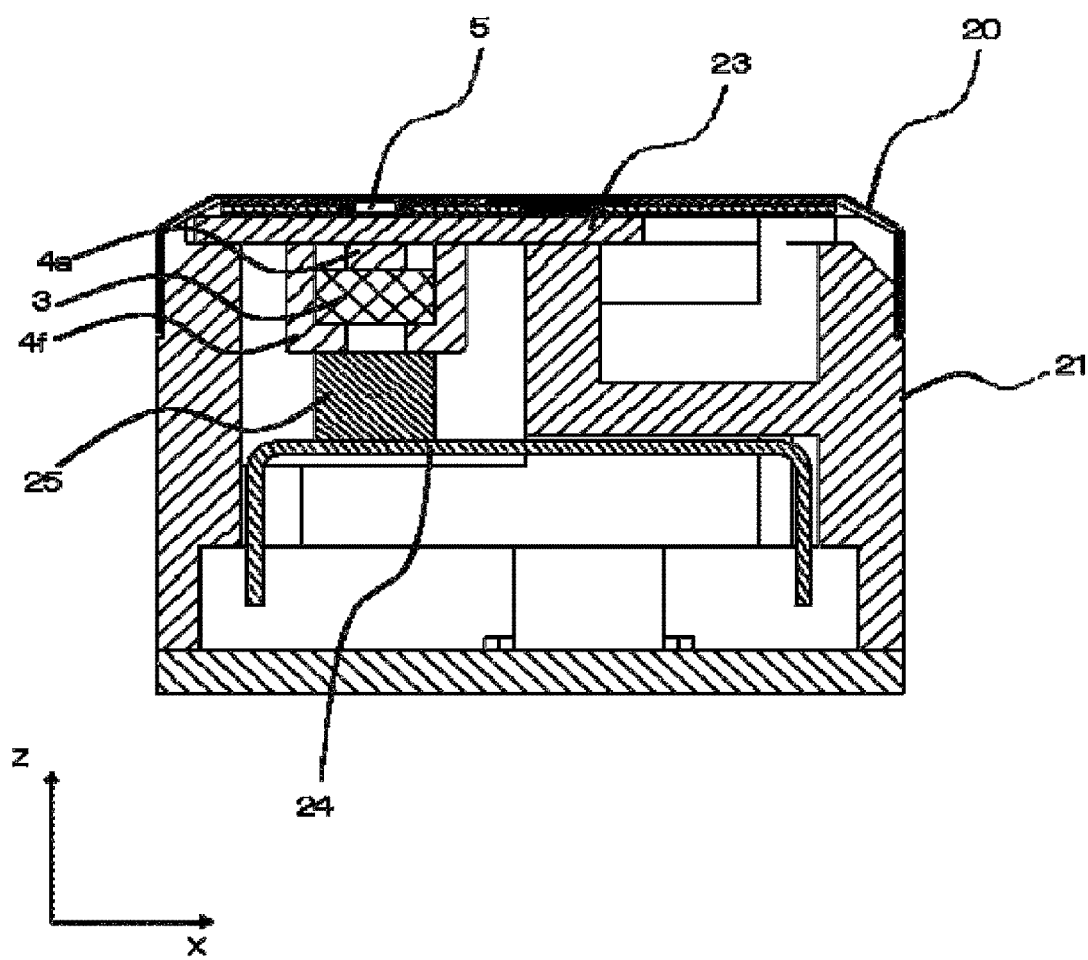
FIG. 29 is a conveyance-direction cross-sectional drawing of the magnetic sensor device of Embodiment 10 of the present disclosure.

Next, FIG. 28 through FIG. 31 are used for description of a yoke 4f and a yoke 4g, which are separate examples of the yoke 4e of the magnetic sensor device of Embodiment 9. As illustrated in FIGS. 28 and 29, the yoke 4e illustrated in FIGS. 26 and 27 is divided into two parts, and although the resultant configuration arranges two yokes 4f, the obtained effect is the same. That is to say, the configuration of the yoke 4f illustrated in FIGS. 28 and 29 is obtained by cutting away part of a portion of the yoke 4e formed on the side of the magnet 3 opposite to the side opposing the magnetoresistance effect elements 5, and exposing the magnet 3 through the cut-away part.

Figure 30:
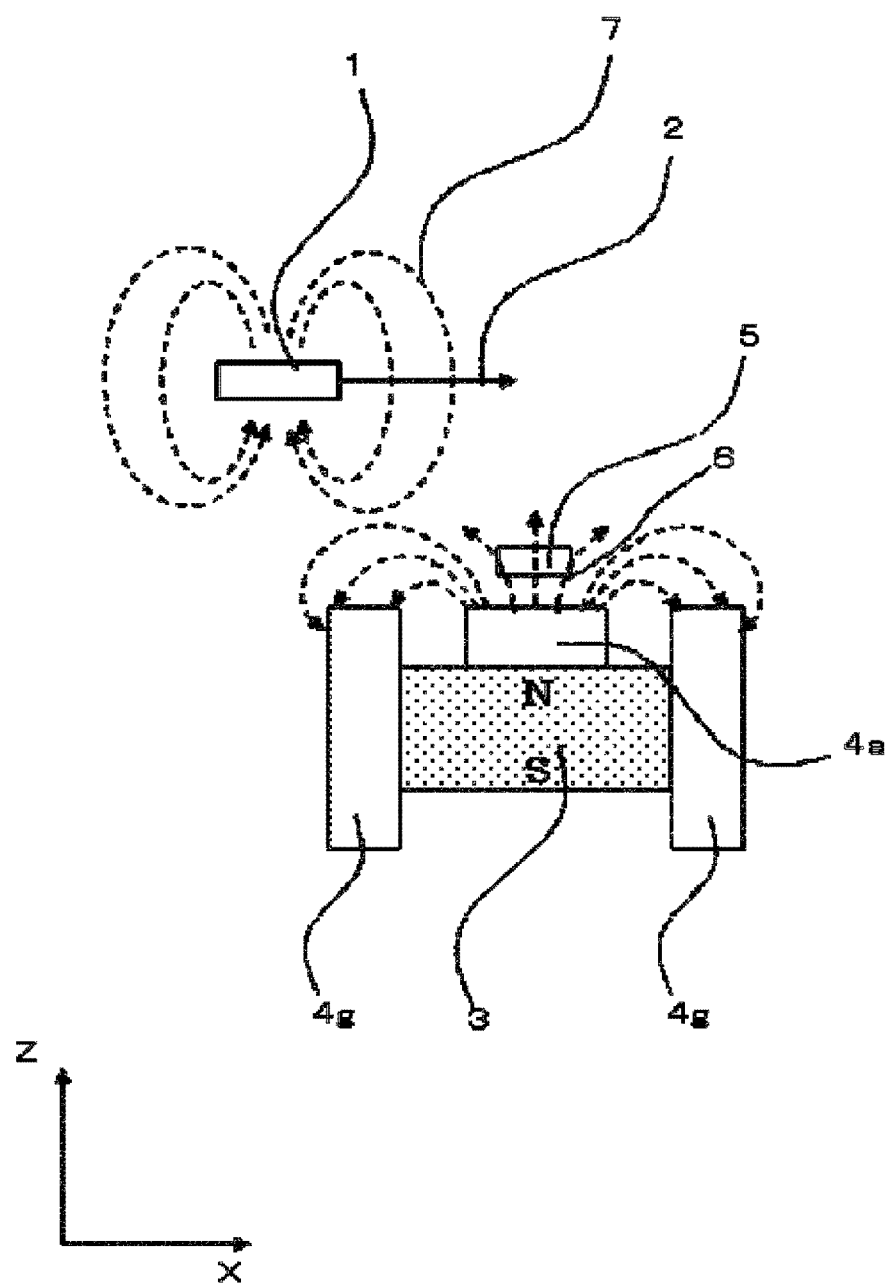
FIG. 30 is a configuration diagram of the magnetic sensor device of Embodiment 10 of the present disclosure.
Figure 31:
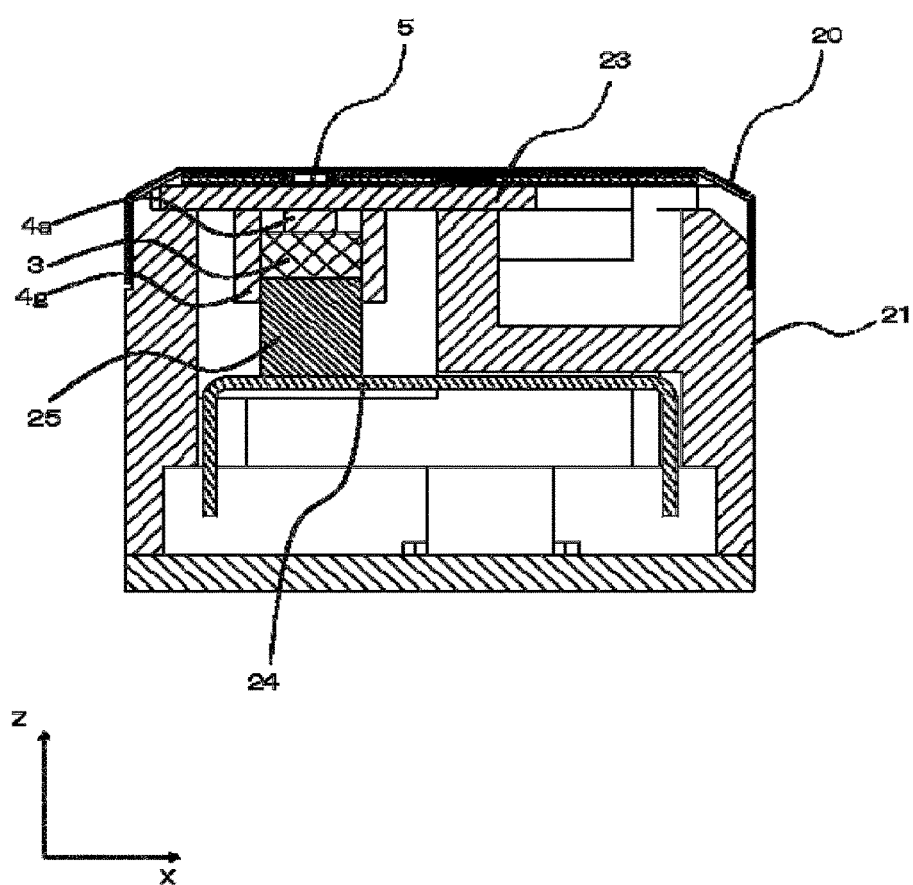
FIG. 31 is a conveyance-direction cross-sectional drawing of the magnetic sensor device of Embodiment 10 of the present disclosure.

Furthermore, the same effect would be obtained even in the case in which no "yoke" is arranged at the side surface of the magnet 3 S-pole side end opposite to the conveyance surface as illustrated in FIGS. 30 and 31, and the yoke 4g is arranged at the magnetization direction lateral face of the magnet 3. That is to say, the configuration of the yoke 4g illustrated in FIGS. 30 and 31 removes the portion formed at the side opposite to the side opposing the magnetoresistance effect elements 5 in the yoke 4e of the magnet 3 illustrated in FIGS. 26 and 27. In other words, the yoke 4g illustrated in FIGS. 30 and 31 can be said to be only the portions of the yoke 4e that are formed at the front end and rear end of the magnet 3.

The yoke 4e in FIG. 27, the yoke 4f in FIG. 29, and the yoke 4g in FIG. 31 are different in shape in comparison to the yoke 4 of FIG. 17, which is described in Embodiment 7. However, in the magnetic sensor device of Embodiment 10, due to contact between the metallic carrier 23 and the yoke 4a, heat from the yoke 4a is conducted to the magnet 3, and is conducted from the magnet 3 to the yoke 4h. In the above described manner, the yoke 4e, yoke 4f and yoke 4g may be made to contact the metallic carrier 23. Thus by making the yoke 4e, yoke 4f, and yoke 4g contact the heat conduction spacer 25, the operation and effect of Embodiment 10 are the same as for Embodiment 7 with respect to heat dissipation.

Further, as illustrated in FIG. 31, the magnetic sensor device of Embodiment 10, rather than just causing contact between the yoke 4g and the heat conduction spacer 25, may also cause contact between the magnet 3 and the heat conduction spacer 25. Of course, the magnetic sensor device of Embodiment 9, without causing contact between the yoke 4d and the heat conduction spacer 25, may cause contact between just the magnet 3 and the heat conduction spacer 25.

Embodiment 11

Figure 32:
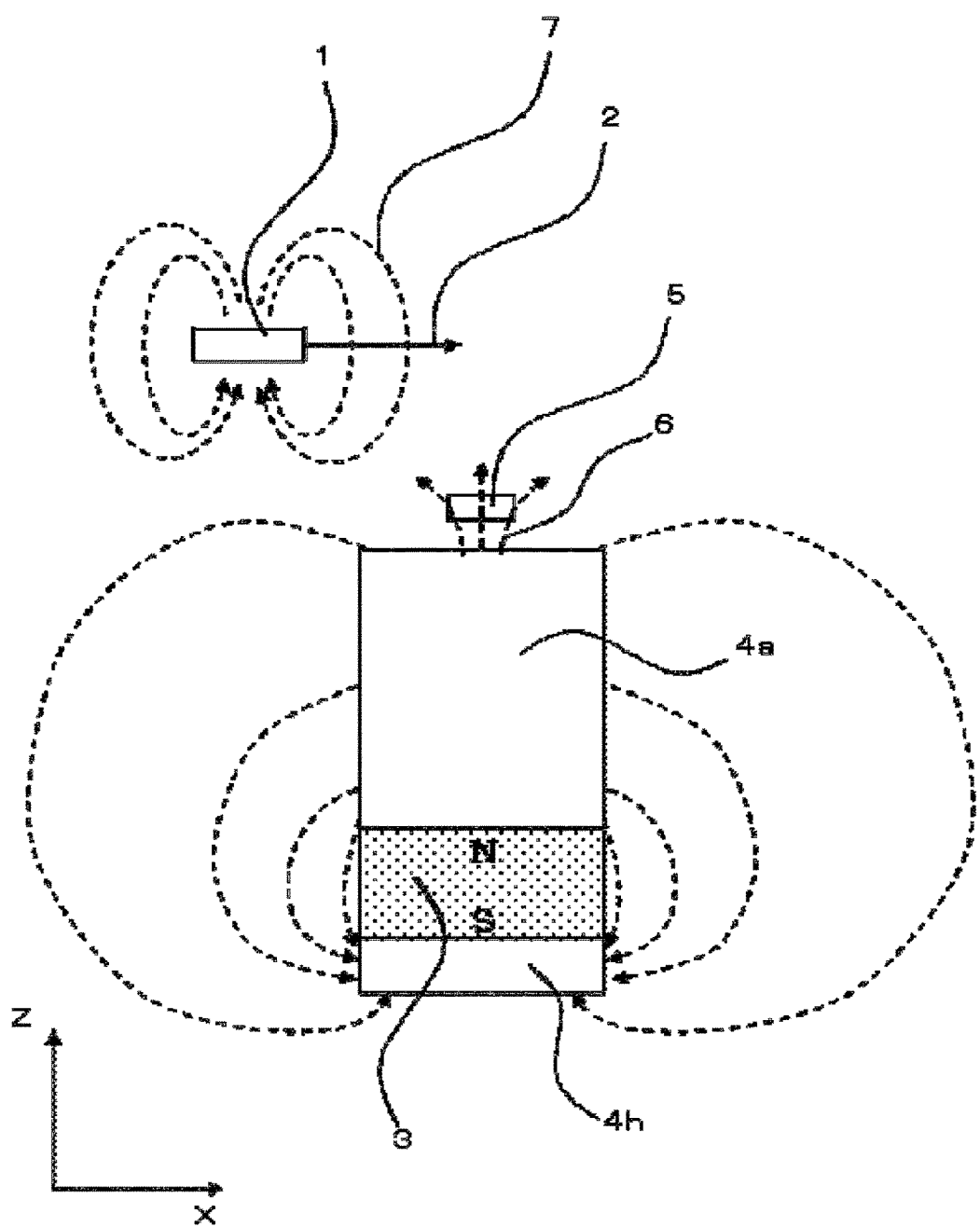
FIG. 32 is a configuration diagram of a magnetic sensor device of Embodiment 11 of the present disclosure.
Figure 33:
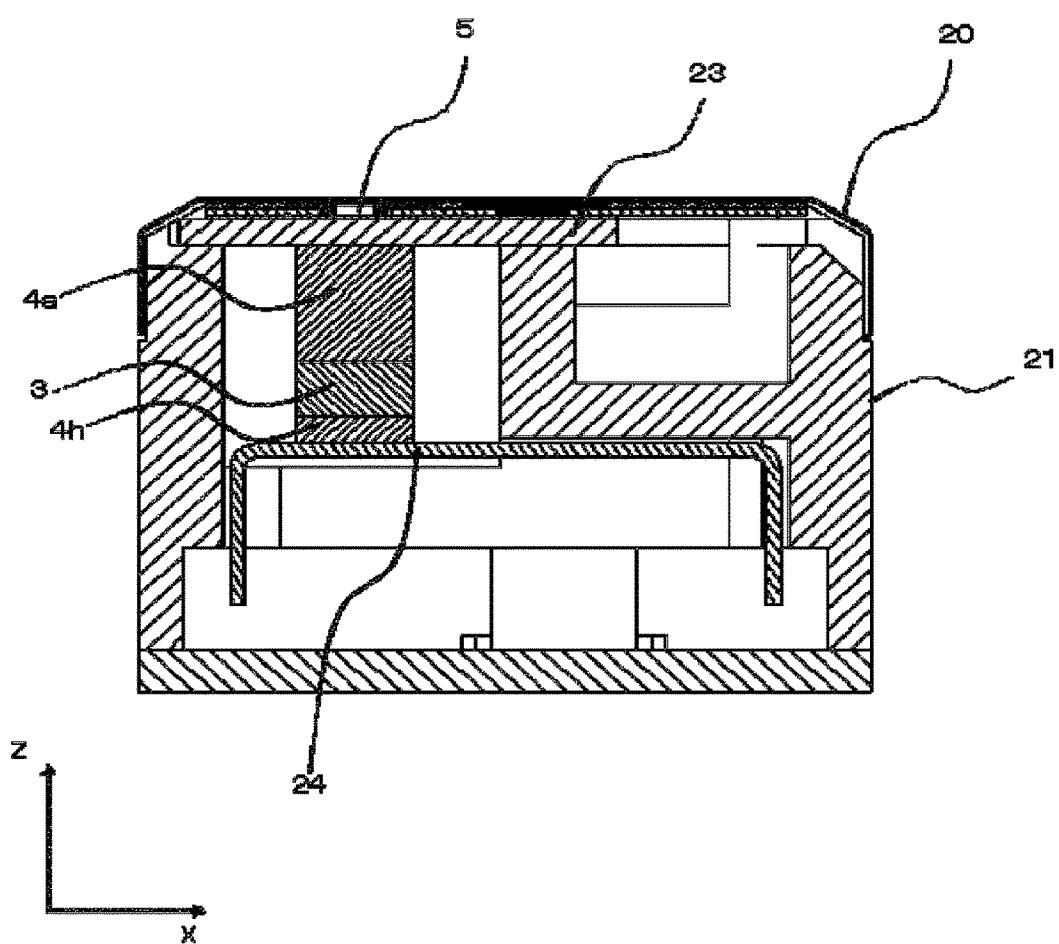
FIG. 33 is a conveyance-direction cross-sectional drawing of the magnetic sensor device of Embodiment 11 of the present disclosure.

Figures are used for description of a magnetic sensor device of Embodiment 11 of this disclosure. FIG. 32 is a configuration diagram of the magnetic sensor device of Embodiment 11. FIG. 33 is a conveyance-direction cross-sectional drawing of the magnetic sensor device of Embodiment 11. In FIGS. 32 and 33, constituent elements that are the same or equivalent to those of FIGS. 8, 9, 10, 18 and 19 are assigned the same reference signs, and descriptions of such constituent elements are omitted. In FIGS. 32 and 33, the magnet 3 has magnetic poles that are mutually different, N pole and S pole, in the direction perpendicular (Z direction) to the conveyance direction 2. That is to say, the magnet 3 has magnetic poles that are arranged along the direction (Z direction) orthogonal to the conveyance direction 2, which is the direction of passage of the object to be detected 1.

The yoke 4a is arranged at the side surface of the magnet 3 N-pole side end extending along the conveyance direction 2. That is to say, the yoke 4a is formed at the side of the magnet 3 opposing the magnetoresistance effect elements 5. The yoke 4h is the second yoke. Thus the yoke 4a may be termed the first yoke. The yoke 4h is arranged at the S-pole side end of the magnet 3. That is to say, the yoke 4h is formed at the side of the magnet 3 opposite to the side opposing the magnetoresistance effect elements 5.

Length of the yoke 4a in the direction (Z direction) perpendicular to the conveyance direction 2 is longer than the length of the magnet 3 and the yoke 4h in the direction (Z direction) perpendicular to the conveyance direction 2. Further, length of the magnet 3 in the Z direction is longer than length of the yoke 4h in the Z direction. Further, three lengths, length of the yoke 4a in the X direction, length of the yoke 4h in the X direction, and length of the magnet 3, are all the same in the X direction. In FIG. 32, the magnetoresistance effect elements 5 are arranged, at central portions of the X-direction width of the magnet 3 N-pole side yoke 4a and the magnet 3 X-direction width, between the yoke 4a and the conveyance path 2 of the object to be detected 1. That is to say, the magnetoresistance effect elements 5 are arranged on a virtual line extending in the Z direction, which is the direction of arrangement of the magnet 3 and yoke 4a. This virtual line is omitted from the figure. Further, the central portion of the magnet 3, the central portion of the yoke 4a, and the central portion of the magnetoresistance effect elements 5 coincide with one another in the X direction. Thus the central portion of the magnet 3, the central portion of the yoke 4a, and the central portion of the magnetoresistance effect elements 5 intersect the Z axis passing through the origin.

The bias magnetic field 6 is described below. The yoke 4a is arranged on the surface extending along the conveyance direction 2 of the side of the magnet 3 N-pole side end, and the yoke 4h is arranged at the S-pole side end of the magnet 3. Due to the Z-direction length of the yoke 4a being longer than that of the magnet 3, for the magnetic field generated from the N pole of the magnet 3, the magnetic field distribution, of the path from both conveyance direction 2 end portions of the yoke 4a to the yoke 4h and the S pole of the magnet 3, becomes dominant. In this manner, the magnetic field, from both conveyance direction 2 ends of the yoke 4a and directed to the magnet 3 S pole and the yoke 4h formed at the S-pole side end, becomes dominate. Thus the magnetic field is not dominant that crosses the yoke 4a from the magnetic pole (N pole) and is released in the vertical direction (Z direction) from the surface of the conveyance path 2 side of the yoke 4a. Thus the magnetic field released in the Z direction becomes small, and the magnetic field directed in the X direction becomes larger. The minute magnetic field perpendicular to the conveyance direction 2 is used as the bias magnetic field 6.

By configuration of the magnetic sensor device in this manner, the magnetic field applied to the object to be detected 1 (hard magnetic material 1a) such as paper currency and the like can become further decreased by the magnet 3, yoke 4a and yoke 4h in the vicinity of the magnetoresistance effect elements 5 in the same manner as the magnetic sensor device of Embodiment 3. Even when the object to be detected 1 includes a soft magnetic material that does not self-generate a magnetic field, the detection level of the soft magnetic material is further decreased, thereby enabling further distinction between the hard magnetic material and the soft magnetic material.

In FIG. 33, a pair of yokes, the yoke 4a and yoke 4h, are arranged at the direction perpendicular to the conveyance direction (Z direction) magnet pole ends of the magnet 3. That is to say, the positional relationship between the "yoke" and the metallic carrier 23 is different from that of FIG. 17. Further, although the metallic carrier 23 contacts the magnet 3 in FIG. 17, the metallic carrier 23 and the magnet 3 do not contact in FIG. 33. However, due to contact between the metallic carrier 23 and the yoke 4a in the magnetic sensor device of Embodiment 11, heat is transmitted from the yoke 4a to the magnet 3 and from the magnet 3 to the yoke 4h. Therefore due to contact between the yoke 4h and the heat conduction spacer 25, the operation and effect of Embodiment 11 are the same as those of Embodiment 7.

As may be understood from the above description, the magnetic sensor device of Embodiment 11 and the magnetic sensor device of Embodiment 8 are different in that the shapes of the yoke 4a and the yoke 4h are different. Although the shapes of the yoke 4a and the yoke 4h are different, the magnetic sensor device of Embodiment 11 and the magnetic sensor device of Embodiment 8 enable use of the minute magnetic field perpendicular to the conveyance direction 2 as the bias magnetic field 6.

REFERENCE SIGNS LIST

1 Object to be detected
1a Hard magnetic material
2 Conveyance path (conveyance direction)
2a Detection region
34 Yoke-attached magnet
3 Magnet
4 Yoke
4h Yoke
4a Yoke
4b Yoke
4c Yoke
4d Yoke
4e Yoke
4f Yoke
4g Yoke
5 Magnetoresistance effect element
5a Component element (first magnetoresistance effect element)
5b Component element (second magnetoresistance effect element)
6 Bias magnetic field
6x X-direction component of bias magnetic field
6v Bias magnetic field vector
7 Hard magnetic material magnetic field
10 Soft magnetic material-sensing magnetic sensor device
11 Magnetic field
20 Shield cover
21 Case
22 Bracket
23 Non-magnetic carrier (metallic carrier)
24 Heat dissipation component
25 Heat conduction spacer
101 Hard magnetic material-sensing magnetic sensor device

The invention claimed is:

1. A magnetic sensor device comprising:
a magnet;
a first yoke arranged on the magnet; and
a magnetoresistance effect element to apply a leakage magnetic field released from the first yoke to outside the first yoke, wherein
a detection region of the magnetoresistance effect element is disposed at a side of the magnetoresistance effect element opposite to the magnet;
the magnetoresistance effect element is to detect a change of a bias magnetic field of the magnetoresistance effect element that occurs when an object to be detected including a hard magnetic material passes through the detection region; and
a magnitude of the leakage magnetic field satisfies a condition that a change of the bias magnetic field of the magnetoresistance effect element that occurs due to a combination of the leakage magnetic field and a magnetic field due to spontaneous magnetization of the object to be detected is larger than a change of the bias magnetic field of the magnetoresistance effect element that occurs due to application of the leakage magnetic field to the object to be detected.

2. The magnetic sensor device according to claim 1, wherein
magnetic poles of the magnet are arranged along a passage direction of passage of the object to be detected;
the first yoke is formed both on a magnetic pole end at a front end of the magnet and on another magnetic pole end at a rear end of the magnet in the passage direction; and
the magnetoresistance effect element is disposed on a virtual line orthogonal to the leakage magnetic field at an intermediate portion in the passage direction of the first yoke formed on the front end of the magnet and on the rear end of the magnet.

3. The magnetic sensor device according to claim 1, wherein
magnetic poles of the magnet are arranged along a direction orthogonal to a passage direction of passage of the object to be detected;
the first yoke is formed at a side of the magnet opposing the magnetoresistance effect element; and
the magnetoresistance effect element is disposed on a virtual line extending in a direction of arrangement of the magnet and the first yoke.

4. The magnetic sensor device according to claim 3, further comprising:
a second yoke arranged on the magnet, wherein
the second yoke is formed at a side of the magnet opposite to the side of the magnet opposing the magnetoresistance effect element; and
a length of the second yoke in the passage direction is shorter than a length of the first yoke in the passage direction.

5. The magnetic sensor device according to claim 3, further comprising:
a second yoke arranged on the magnet, wherein
the second yoke is formed in the passage direction on both a front end and a rear end of the magnet.

6. The magnetic sensor device according to claim 5, wherein
the second yoke is continuous from the side of the magnet opposite the magnetoresistance effect element to the side of the magnet opposing the magnetoresistance effect element.

7. The magnetic sensor device according to claim 1, wherein
the magnetoresistance effect element comprises a plurality of component elements arranged along a longitudinal direction intersecting a conveyance direction, the conveyance direction being a direction of passage through the detection region; and
the component elements are formed tilted relative to the conveyance direction and the longitudinal direction.

8. The magnetic sensor device according to claim 3, wherein
the magnetoresistance effect element comprises a plurality of component elements arranged along a longitudinal direction intersecting a conveyance direction, the conveyance direction being the direction of passage through the detection region;
the component elements are formed tilted relative to the conveyance direction and the longitudinal direction;
the component elements are arranged in two rows extending along the longitudinal direction; and
among the component elements arranged in one of the two rows and in another of the two rows, the component elements adjacent to one another in the conveyance direction have mutually different directions of tilt.

9. The magnetic sensor device according to claim 7, wherein
the component elements adjacent to one another in the longitudinal direction have the same tilt.

10. A magnetic sensor device comprising:
a magnet;
a first yoke arranged on the magnet;
a magnetoresistance effect element to apply a leakage magnetic field released from the first yoke to outside the first yoke; and
a second yoke arranged on the magnet, wherein
a detection region of the magnetoresistance effect element is disposed at a side of the magnetoresistance effect element opposite to the magnet;
the magnetoresistance effect element is to detect a change of a bias magnetic field of the magnetoresistance effect element that occurs when an object to be detected including a hard magnetic material passes through the detection region;
the magnetoresistance effect element is disposed on a virtual line extending in a direction of arrangement of the magnet and the first yoke;
magnetic poles of the magnet are arranged along a direction orthogonal to a passage direction of passage of the object to be detected;
the first yoke is formed at a side of the magnet opposing the magnetoresistance effect element;
the second yoke is formed at a side of the magnet opposite to the side of the magnet opposing the magnetoresistance effect element; and
a length of the second yoke in the passage direction is shorter than a length of the first yoke in the passage direction.

11. The magnetic sensor device according to claim 10, wherein
the magnetoresistance effect element comprises a plurality of component elements arranged along a longitudinal direction intersecting a conveyance direction, the conveyance direction being a direction of passage through the detection region; and
the component elements are formed tilted relative to the conveyance direction and the longitudinal direction.

12. The magnetic sensor device according to claim 10, wherein
the magnetoresistance effect element comprises a plurality of component elements arranged along a longitudinal direction intersecting a conveyance direction, the conveyance direction being the direction of passage through the detection region;
the component elements are formed tilted relative to the conveyance direction and the longitudinal direction;
the component elements are arranged in two rows extending along the longitudinal direction; and
among the component elements arranged in one of the two rows and in another of the two rows, the component elements adjacent to one another in the conveyance direction have mutually different directions of tilt.

13. The magnetic sensor device according to claim 11, wherein
the component elements adjacent to one another in the longitudinal direction have the same tilt.

14. The magnetic sensor device according to claim 12, wherein
the component elements adjacent to one another in the longitudinal direction have the same tilt.

15. A magnetic sensor device comprising:
a magnet;
a first yoke arranged on the magnet;
a magnetoresistance effect element to apply a leakage magnetic field released from the first yoke to outside the first yoke; and
a second yoke arranged on the magnet, wherein
a detection region of the magnetoresistance effect element is disposed at a side of the magnetoresistance effect element opposite to the magnet;
the magnetoresistance effect element is to detect a change of a bias magnetic field of the magnetoresistance effect element that occurs when an object to be detected including a hard magnetic material passes through the detection region;
the magnetoresistance effect element is disposed on a virtual line extending in a direction of arrangement of the magnet and the first yoke;
magnetic poles of the magnet are arranged along a direction orthogonal to a passage direction of passage of the object to be detected;
the first yoke is formed at a side of the magnet opposing the magnetoresistance effect element;

the second yoke is formed in the passage direction on both a front end and a rear end of the magnet; and the second yoke is continuous from the side of the magnet opposite the magnetoresistance effect element to the side of the magnet opposing the magnetoresistance effect element.

16. The magnetic sensor device according to claim 15, wherein the magnetoresistance effect element comprises a plurality of component elements arranged along a longitudinal direction intersecting a conveyance direction, the conveyance direction being a direction of passage through the detection region; and the component elements are formed tilted relative to the conveyance direction and the longitudinal direction.

17. The magnetic sensor device according to claim 15, wherein the magnetoresistance effect element comprises a plurality of component elements arranged along a longitudinal direction intersecting a conveyance direction, the conveyance direction being the direction of passage through the detection region;

the component elements are formed tilted relative to the conveyance direction and the longitudinal direction;

the component elements are arranged in two rows extending along the longitudinal direction; and among the component elements arranged in one of the two rows and in another of the two rows, the component elements adjacent to one another in the conveyance direction have mutually different directions of tilt.

18. The magnetic sensor device according to claim 16, wherein the component elements adjacent to one another in the longitudinal direction have the same tilt.

19. The magnetic sensor device according to claim 17, wherein the component elements adjacent to one another in the longitudinal direction have the same tilt.

* * * * *